(12) United States Patent
Hébert

(10) Patent No.: US 9,368,614 B2
(45) Date of Patent: *Jun. 14, 2016

(54) FLEXIBLY SCALABLE CHARGE BALANCED VERTICAL SEMICONDUCTOR POWER DEVICES WITH A SUPER-JUNCTION STRUCTURE

(71) Applicant: Alpha and Omega Semiconductor Incorporated, Sunnyvale, CA (US)

(72) Inventor: François Hébert, San Mateo, CA (US)

(73) Assignee: Alpha and Omega Semiconductor Incorporated, Sunnyvale, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 13/954,909

(22) Filed: Jul. 30, 2013

(65) Prior Publication Data

US 2015/0035051 A1 Feb. 5, 2015

Related U.S. Application Data

(62) Division of application No. 12/807,116, filed on Aug. 26, 2010, now Pat. No. 8,502,312, which is a division of application No. 12/229,250, filed on Aug. 20, 2008, now Pat. No. 7,790,549.

(51) Int. Cl.

| H01L 29/76 | (2006.01) |
|---|---|
| H01L 29/94 | (2006.01) |
| H01L 31/062 | (2012.01) |
| H01L 31/113 | (2006.01) |
| H01L 31/119 | (2006.01) |
| H01L 29/78 | (2006.01) |
| H01L 21/265 | (2006.01) |
| H01L 29/66 | (2006.01) |
| H01L 29/08 | (2006.01) |

(52) U.S. Cl.
CPC ...... *H01L 29/7813* (2013.01); *H01L 21/26586* (2013.01); *H01L 29/0878* (2013.01); *H01L 29/0886* (2013.01); *H01L 29/66734* (2013.01)

(58) Field of Classification Search
CPC ....... H01L 29/76; H01L 29/94; H01L 31/062; H01L 31/113; H01L 31/119; H01L 29/7813; H01L 29/4236; H01L 29/41766; H01L 29/42368
USPC ............................ 257/330, 331, 332, E21.09
See application file for complete search history.

(56) References Cited

U.S. PATENT DOCUMENTS

| 7,456,094 B2 * | 11/2008 | Ma et al. ............... 438/629 |
| 7,554,155 B2 * | 6/2009 | Saito et al. ............ 257/341 |
| 7,800,170 B1 * | 9/2010 | He ................. H01L 29/456 257/330 |

(Continued)

*Primary Examiner* — Phuc Dang
(74) *Attorney, Agent, or Firm* — Bo-In Lin

(57) ABSTRACT

This invention discloses a semiconductor power device disposed in a semiconductor substrate and the semiconductor substrate has a plurality of deep trenches. The deep trenches are filled with an epitaxial layer thus forming a top epitaxial layer covering areas above a top surface of the deep trenches covering over the semiconductor substrate. The semiconductor power device further includes a plurality of transistor cells disposed in the top epitaxial layer whereby a device performance of the semiconductor power device is dependent on a depth of the deep trenches and not dependent on a thickness of the top epitaxial layer. Each of the plurality of transistor cells includes a trench DMOS transistor cell having a trench gate opened through the top epitaxial layer and filled with a gate dielectric material.

9 Claims, 50 Drawing Sheets

(56) References Cited

U.S. PATENT DOCUMENTS 8,324,053 B2* 12/2012 Bobde ................. H01L 29/7806
257/328
2005/0242411 A1* 11/2005 Tso ............................... 257/480
2010/0044791 A1* 2/2010 Hebert .......................... 257/341
2010/0065903 A1* 3/2010 Parthasarathy ..... H01L 29/0657
257/329
2010/0279478 A1* 11/2010 Hsieh ............................ 438/270

* cited by examiner

FLEXIBLY SCALABLE CHARGE BALANCED VERTICAL SEMICONDUCTOR POWER DEVICES WITH A SUPER-JUNCTION STRUCTURE

This is a Divisional Application of a previously filed co-pending Application with a Ser. No. 12/807,116 filed on Aug. 26, 2010 by identical common inventors of this Application. Application with Ser. No. 12/807,116 is a Divisional Application of another application Ser. No. 12/229,250 filed on Aug. 20, 2008 by identical common inventors of this Application and now issued into U.S. Pat. No. 7,790,549. The disclosures made in application Ser. Nos. 12/807,116 and 12/229,250 are hereby incorporated by reference in this patent application.

BACKGROUND OF THE INVENTION

1. Field of the Invention

The invention relates generally to the vertical semiconductor power devices. More particularly, this invention relates to configurations and methods implemented with a single thin epitaxial layer with improved manufacturability for manufacturing flexibly scalable charge balanced vertical semiconductor power devices with a super-junction structure with simple manufacturing processes independent of the targeted breakdown voltage.

2. Description of the Prior Art

Conventional manufacturing technologies and device configuration to further increase the breakdown voltage with reduced series resistance are still confronted with manufacturability difficulties. The practical applications and usefulness of the high voltage semiconductor power devices are limited due to the facts that the conventional high power devices generally have structural features that require numerous time-consuming, complex, and expensive manufacturing processes. As will be further discussed below, some of the processes for manufacturing the high voltage power devices are complicated thus having low throughput and low yields. Furthermore, instead of using a raw semiconductor wafer, the semiconductor power devices are generally fabricated with preprocessed wafer formed with an epitaxial layer thereon. The production costs of the semiconductor power devices are therefore increased. Also, the functionality and performance characteristics are often dictated by the process parameters applied in forming this epitaxial layer. For these reasons, the application of such preprocessed wafers further limits the manufacturability and the production flexibility of the power devices that are now dependent on the original preprocessed wafer employed to manufacture the semiconductor power devices.

In comparison to conventional technologies, the super-junction technologies have advantages to achieve higher breakdown voltage (BV) without unduly increasing the Rdson resistance. For standard power transistor cells, breakdown voltage is supported largely on the low-doped drift layer. Therefore, the drift layer is made with greater thickness and with relatively low doping concentration to achieve higher voltage ratings. However this also has the effect of greatly increasing the Rdson resistance. In the conventional power devices, the resistance Rdson has approximately a functional relationship represented by:

$$Rdson \propto BV^{2.5}$$

In contrast, a device having a super-junction configuration is implemented with a charge balanced drift region. The resistance Rdson has a more favorable functional relationship with the breakdown voltage. The functional relationship can be represented as:

$$Rdson \propto BV$$

For high voltage applications, it is therefore desirable to improve the device performance by designing and manufacturing the semiconductor power devices with super-junction configurations for reducing the resistance Rdson while achieving high breakdown voltage. Regions adjacent to the channel within the drift region are formed with an opposite conductivity type. The drift region may be relatively highly doped, so long as the regions adjacent to the channel are similarly doped but of an opposite conductivity type. During the off state, the charges of the two regions balance out such that the drift, region becomes depleted, and can support a high voltage. This is referred to as the super-junction effect. During the on state, the drift region has a lower resistance Rdson because of a higher doping concentration.

However, conventional super-junction technologies still have technical limitations and difficulties when implemented to manufacture the power devices. Specifically, multiple epitaxial layers and/or buried layers are required in some of the conventional structures. Multiple etch back and chemical mechanical polishing (CMP) processes are necessary in many of the device structures according to the previous manufacturing processes. Furthermore, the manufacturing processes often require equipment not compatible with standard foundry processes. For example, many standard high-volume semiconductor foundries have oxide CMP (chemical mechanical polishing) but do not have silicon CMP, which is required for some superjunction approaches. Additionally, these devices have structural features and manufacturing processes not conducive to scalability for low to high voltage applications. In other words, some approaches would become too costly and/or too lengthy to be applied to higher voltage ratings. As will be further reviewed and discussions below, these conventional devices with different structural features and manufactured by various processing methods, each has limitations and difficulties that hinder practical applications of these devices as now demanded in the marketplace.

There are three basic, types of semiconductor power device structures for high voltage applications. The first type includes those device formed with standard structures as depicted in FIG. 1A for a standard VDMOS that do not incorporate the functional feature of charge balance. For this reason, there is no breakdown voltage enhancement beyond the one-dimensional theoretical figure of merit, i.e., the Johnson limit, according to the I-V performance measurements and further confirmed by simulation analyses of this type of devices. The devices with this structure generally have relatively high on-resistance due to the low drain drift region doping concentration in order to satisfy the high breakdown voltage requirement. In order to reduce the on resistance Rdson, this type of devices generally requires large die size. Despite the advantages that the devices can be manufactured with simple processes and low manufacturing cost, these devices are however not feasible for high current low resistance applications in the standard packages due the above discussed drawbacks: the die cost becomes prohibitive (because there are too few dies per wafer) and it becomes impossible to fit the larger die in the standard accepted packages.

The second type of devices includes structures provided with two-dimensional charge balance to achieve a breakdown voltage higher than the Johnson limit for a given resistance, or a lower specific resistance (Rdson*Area product) than the Johnson limit for a given breakdown voltage. This type of device structure is generally referred to as devices implemented with the super junction technology. In the super junction structure, a charge-balance along a direction parallel to the current flow in the drift drain region of a vertical device, based on PN junctions such as CoolMOS™ structures by Infineon, and field plate techniques implemented in oxide bypassed devices to enable a device to achieve a higher breakdown voltage. The third type of structure involves a three-dimensional charge-balance where the coupling is both in the lateral as well as the vertical directions. Since the purpose of this invention is to improve the structural, configurations and manufacturing processes of devices implemented with super junction technologies to achieve two-dimensional charge balance, the limitations and difficulties of devices with super junction will be reviewed and discussed below.

FIG. 1B is a cross sectional view of a device with super junction to reduce the specific resistance (Rsp, resistance times active area) of the device by increasing the drain dopant concentration in the drift region while maintaining the specified breakdown voltage. The charge balance is achieved by providing P-type vertical columns formed in the drain to result in lateral and complete depletion of the drain at high voltage to thus pinch off and shield the channel from the high voltage drain at the N+ substrate. Such technologies have been disclosed in Europe Patent 0053854 (1982), U.S. Pat. No. 4,754,310, specifically in FIG. 13 of that patent and U.S. Pat. No. 5,216,275. In these previous disclosures, the vertical super junctions are formed as vertical columns of N' and P type dopant. In vertical DMOS devices, the vertical charge balance is achieved by a structure with sidewall doping to form one of the doped columns as were illustrated in drawings. In addition to doped columns, doped floating islands have been implemented to increase the breakdown voltage or to reduce the resistance as disclosed by U.S. Pat. Nos. 4,134, 123 and 6,037,632. Such device structure of super junction still relies on the depletion of the P-regions to shield the gate/channel from the drain. The floating island structure is limited by the technical difficulties due to charge storage and switching issues.

For super junction types of devices, the manufacturing methods are generally very complex, expensive and require long processing time due to the facts that the methods require multiple steps and several of these steps are slow and have a low throughput. Specifically, the steps may involve multiple epitaxial layers and buried layers. Some of the structures require deep trenches through the entire drift region and require etch back or chemical mechanical polishing in most these processes. For these reasons, the conventional structures and manufacture methods are limited by slow and expensive manufacturing processes and are not economical for broad applications.

Therefore, a need still exists in the art of power semiconductor device design and manufacture to provide new device configurations and manufacturing method in forming the power devices such that the above discussed problems and limitations can be resolved.

SUMMARY OF THE PRESENT INVENTION

It is therefore an aspect of the present invention to provide a new and improved device structure and manufacturing method to form the doped columns in the drift regions for charge balance with simple and convenient processing steps achieved through doping trench sidewalls of deep trenches that do not extend through the entire vertical drift region. There are no etch-backs or CMP (chemical mechanical polishing) required thus reducing the processing steps and can be implemented with just forming a single thin epitaxial layer, grown in a vertical trench and on the top surface on the areas surrounding the trench to achieve the super-junction structure. The deep trench is located in the drift region, and provides the super-junction effect through charge balance with the drift region. The structure and configuration of the super junction structure as that disclosed in this invention may be implemented independent of the targeted range of the breakdown voltages. The manufacturing processes are simplified and can be conveniently manufactured with standard processing using standard processing modules and equipment. The manufacturing processes are further simplified because the transistor portion of the structure, e.g., the trench gate DMOS, is self-aligned. Therefore, the above discussed technical difficulties and limitations can be resolved.

Specifically, it is an aspect of the present invention to provide a new and improved device structure and manufacturing method to form the P-epitaxial layer in a vertical trench with the P-epitaxial layer including a thin top epitaxial layer covering over the top surface of the surrounding areas above the vertical trenches. The P-epitaxial layer filling the trench, and the thin top epitaxial layer are actually the same single epitaxial layer, grown simultaneously. The MOSFET transistor cells are formed in this top thin epitaxial layer. Trench gates are opened through the top thin epitaxial layer with trench sidewalls and trench bottom dopant implant zones to eliminate the sensitivity of the channel performance that may be affected by the depth of the trench gates and the dopant concentration of the P-epitaxial layer. The trench gates allow the formation of vertical channels connected the source region formed on top of the drift region in the semiconductor substrate. The performance of the transistor cells can be well controlled and adjusted by simplified and conveniently processing steps. The super-junction configurations disclosed in this invention is further scalable for broad ranges of applications.

It is another aspect of the present invention to provide a new and improved device structure and manufacturing method to form the power transistor cells on a thin top layer formed as a P-epitaxial layer covering over vertical trenches on the top surface surrounding areas above the vertical trenches. Before the deep trenches are filled with the P-epitaxial layer, an ion implant is carried out through the sidewalls of the deep trenches to adjust the dopant concentration of the regions surrounding the deep trenches. The N-dopant implant thus provides N-column charge control to further adjust and tune the performance of the semiconductor power devices for different type of applications.

It is another aspect of the present invention to provide new and improved device structure and manufacturing method to form the power transistor cells with shallow trench gates on thin top P-epitaxial layer covering over vertical trenches on the top surface surrounding areas above the vertical trenches. Flexible device channel performance can be adjusted and implemented with a trench bottom dopant implant and sidewall dopant implants. The sidewall dopant implants and the trench bottom implant are applied to compensate the P-epitaxial and to assure appropriate accumulation and the channel regions.

It is another aspect of the present invention to provide new and improved device structure and manufacturing method to form the power transistor cells with deeper trench gates in a thin top layer formed as a P-epitaxial layer covering over vertical trenches on the top surface surrounding areas above the vertical trenches. The deep trench gates penetrate through the top thin epitaxial layer and extend into the N substrate regions thus a trench bottom dopant implant may no longer necessary.

Briefly in a preferred embodiment this invention discloses a semiconductor power device disposed in a semiconductor substrate and the semiconductor substrate has a plurality of deep trenches. The deep trenches are filled with an epitaxial layer and a top epitaxial layer covering areas above a top surface of the deep trenches covering over the semiconductor substrate. The semiconductor power device further includes a plurality of transistor cells disposed in the top epitaxial layer whereby a device performance of the semiconductor power device is dependent on a depth of the deep trenches and not dependent on a thickness of the top epitaxial layer. Each of the plurality of transistor cells includes a trench DMOS transistor cell having a trench gate opened through the top epitaxial layer and filled with a gate dielectric material. In an exemplary embodiment, each of the plurality of transistor cells includes a trench DMOS transistor cell having a trench gate opened through the top epitaxial layer and penetrating into a top portion of the semiconductor substrate and the trench gate is filled with a gate dielectric material. In another exemplary embodiment, each of the plurality of transistor cells includes a trench DMOS transistor cell having a trench gate opened through the top epitaxial layer having a gate trench depth less than or equal to a thickness of the top epitaxial layer and the trench gate is filled with a gate dielectric material. In an exemplary embodiment, each of the DMOS transistor cells further having gate sidewall dopant regions surrounding sidewalls of the trench gate and a gate-bottom dopant region below the trench gate. In an exemplary embodiment, each of the plurality of transistor cells includes a vertical transistor cell disposed in the top epitaxial layer. The portions of the semiconductor substrate adjacent to the deep trenches act as the drift layer to the vertical transistors and achieve the super-junction effect through charge balance with the portions of the epitaxial layer in the deep trenches. The semiconductor power device further includes a drain contact dopant region surrounding a bottom portion of the deep trenches near a bottom surface of the semiconductor substrate for connecting to a drain electrode. In another exemplary embodiment, the semiconductor power device further includes a bottom metal layer constituting a drain electrode contact the drain contact dopant region.

This invention further discloses a method for forming a semiconductor power device on a semiconductor substrate. The method includes a step of opening a plurality of deep trenches and filling the deep trench with an epitaxial layer overflowing and covering a top surface of the semiconductor substrate with a top epitaxial layer. The method further includes another step of forming a plurality of transistor cells in the top epitaxial layer for adjusting a device performance of the semiconductor power device to depend on a depth of the deep trenches and not dependent on a thickness of the top epitaxial layer. In an exemplary embodiment, the method further includes a step of forming dopant gradients in regions of the semiconductor substrate between the deep trenches by implanting dopant ions through sidewalls of the deep trenches and adjusting the device performance of the semiconductor power device by adjusting dopant concentrations of the dopant gradients. In another exemplary embodiment, the method does not include the step of implanting dopant ions through sidewalls of the deep trenches, but forms doping columns by selects a substrate with the appropriate initial doping concentration. In another exemplary embodiment, the method further includes a step of controlling a thickness of the top epitaxial layer by adjusting a width of the deep trenches.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 1A:
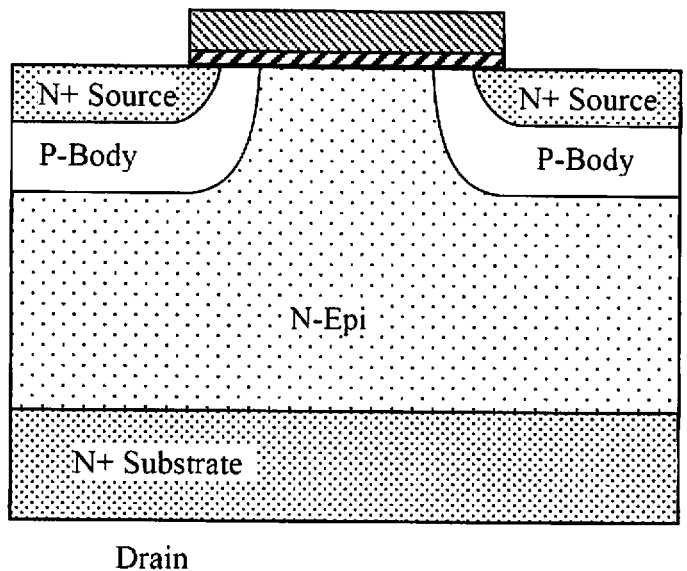
FIGS. 1A to 1B are cross sectional views for showing conventional vertical power device configurations manufactured by conventional methods.
Figure 1B:
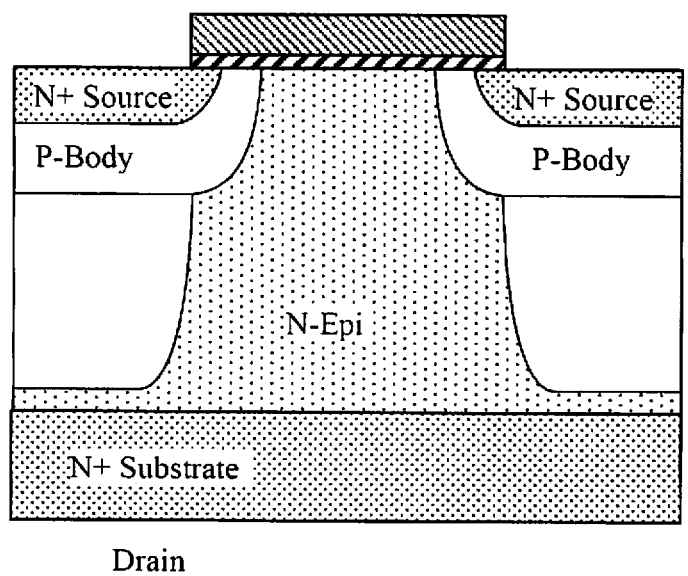
Figure 2:
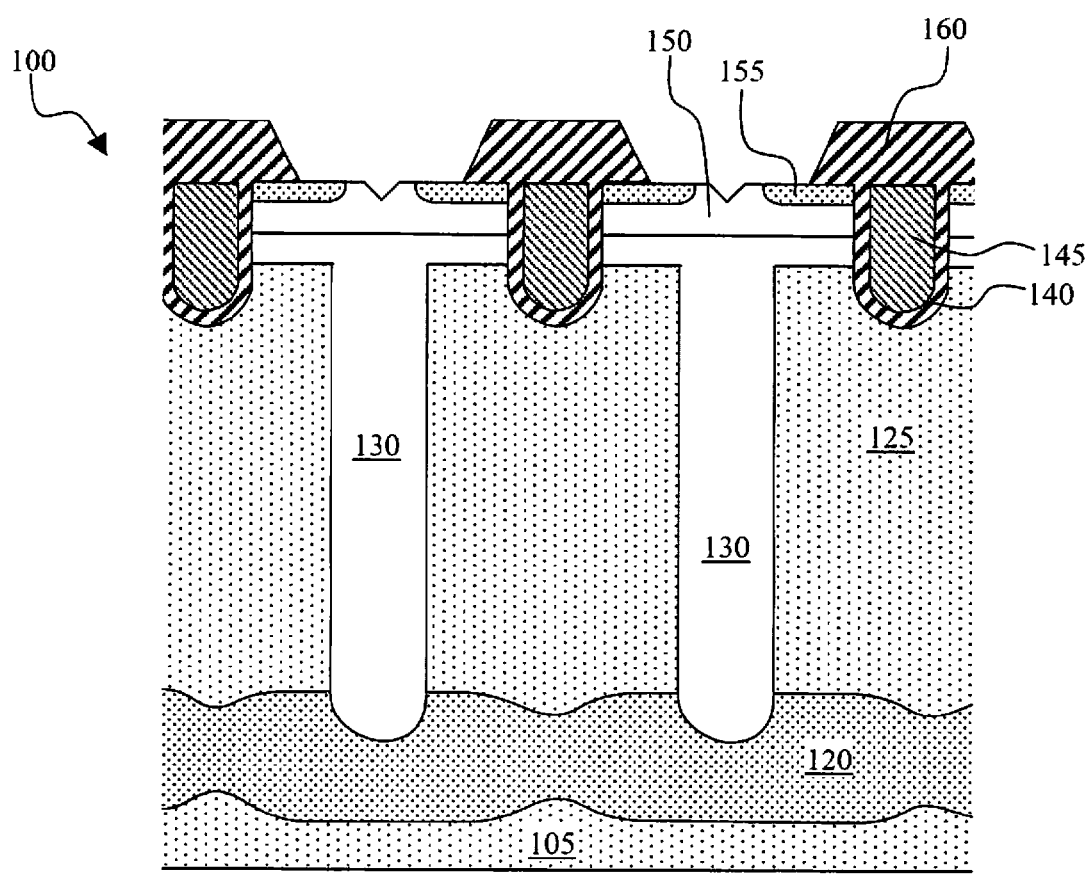
FIGS. 2 to 8 are cross sectional views of high voltage power devices with super junction structure as different embodiments of this invention.
Figure 3:
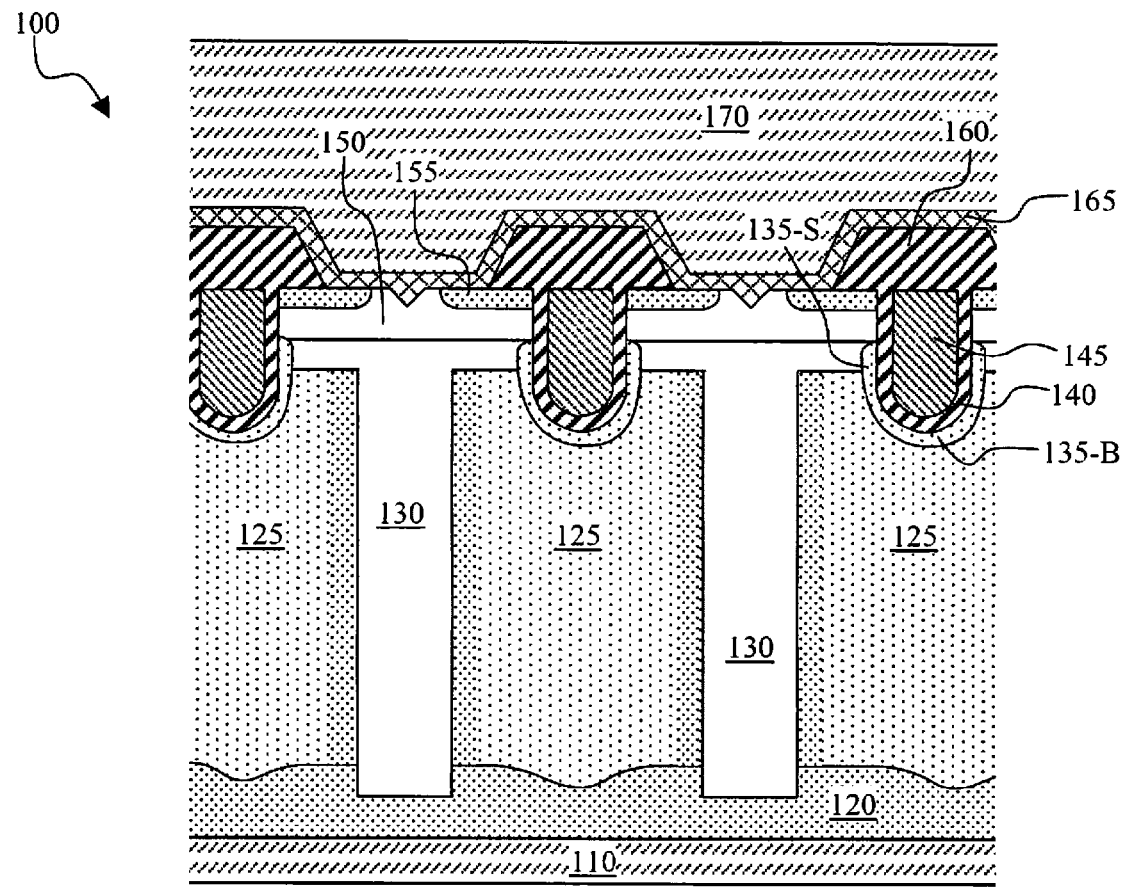

Referring to FIG. 2 for a cross sectional view of a MOSFET device 100 that illustrates the new concepts including the new structural and manufacturing features of this invention. The details of the MOSFET device 100 will be further described and explained in FIG. 3. The MOSFET device 100 is supported on an N type substrate 105 that includes a N+ doped bottom region 120 functioning as drain contact region doped through deep trenches 130 (after back grinding, as shown in FIG. 3 below) that is filled with a P-epitaxial layer therein. The MOSFET transistor cells are supported on the single thin P-epitaxial layer filling in epitaxial column trenches 130 and covering over the top surface surrounding the P-epitaxial columns that has the P-epitaxial filling in the column trenches. The thin P-epitaxial region at the top is formed with the body regions 150 surrounding the trench gate 145 filled with gate polysilicon therein. The P-body regions 150 further encompass the source regions 155 surrounding the trench gates 145. Note that the P-epitaxial layer 130 is of an opposite conductivity type as the N+ substrate region 105. The trench gates 145 is padded with a gate oxide layer 140 and covered with an insulation layer 160 with contact openings to allow a source contact metal to contact the source-body regions between the trench gates 145. The active areas are formed on the flat portions of the P-epitaxial layer, located away from the seams directly over the deep trenches 130. The delicate trench gates are formed in the top portions of the epitaxial layer Between the deep trenches 130, where the surface is flat and smooth. For this reason, a CMP of the P-epitaxial layer is not required for this device.

The device as shown in FIG. 2 provides a single thin epitaxial layer to form the trench gates with gate polysilicon filled in the trenches opened therethrough. The new configuration achieves a super-junction structure independent of the requirement of a particular breakdown voltage. The new configuration achieves super-junction performance, i.e., performance below the "Johnson Limit", with breakdown voltage independent of the thickness of the epitaxial layer grown on the starting substrate. It is the depth of the trench into the semiconductor substrate (as well as the doping concentration of the substrate and of any implants and diffusions performed inside the trenches), which sets the breakdown voltage. The thickness of the epitaxial silicon growth is only a function of the width of the trenches, which are etched in the silicon substrate. Conventional devices do not have this flexibility and must grow epitaxial layers, which have a thickness, proportional to the desired breakdown voltage.

The structure shown is flexibly scalable and the device can be manufactured by applying simple manufacturing technologies. For example, a device capable of achieving a low specific resistance below the Johnson Limit, over a wide range of breakdown voltage (200V to 900V for example) can be realized by using a single epitaxial silicon layer growth of a few microns, and a single trench etch with a depth proportional to the desired breakdown voltage (about 10-15 micron for >200V, about 40-50 micron for >600V and about 70-90 micron for >900V).

Furthermore, the transistor portion of the device supported on the top portion of the epitaxial layer 130 is structured as trench-gate DMOS device wherein the device configuration is self-aligned and can be conveniently and easily manufactured.

Referring to FIG. 3 for a cross sectional view of a MOSFET device 100 with the new concepts and basic structures illustrated in FIG. 2 and manufactured according the processes described in FIGS. 9A to 9M below. The MOSFET device 100 is supported on an N type substrate includes a N+ doped bottom region 120 functioning as drain contact region immediately above and in contact with a bottom drain electrode 110. The drain contact regions 120 are doped through deep trenches 130. Each of these deep trenches is filled with a P-epitaxial layer filling the trenches and covering the surrounding top surfaces over the trenches 130. The MOSFET transistor cells are supported on the single thin P-epitaxial layer that fills in epitaxial column trenches 130 and covering over the top surface surrounding the P-epitaxial columns. The thin P-epitaxial layer over the top is formed with P-body regions 150 surrounding the trench gates 145 with gate polysilicon filling in the trenches opened through the top epitaxial layer 130. The P-body regions further encompass the source regions 155 surrounding the trench gates 145. The trench gates 145 are padded with a gate oxide layer 140 and covered with an insulation layer 160 with contact openings to allow a source contact metal 170 over a metal barrier layer 165 to contact the source-body regions between the trench gates 145. The N substrate regions 125 surrounding the P-epitaxial columns 130 are implanted with N-dopant to create a lateral doping concentration gradient for achieving a N-column charge control. The Super-Junction effect, or charge balance, is achieved by ensuring that the electrical charges of the P-epitaxial layer filled in the trenches is laterally balanced, i.e., balanced along the distance that is perpendicular to the drain current flow in the drift region of the vertical MOSFET structure, so that they deplete when the MOSFET is in the off state. In other words, the electrical charges of the P-epitaxial layer filled in the trenches are substantially equal to the electrical charges of the N-drift region adjacent to the N-substrate within the manufacturing tolerances. The electrical charges in the N-drift region can be controlled and adjusted by controlling either the doping of the N-substrate, or the doping of the N-substrate plus any additional N-dopant ions, which may be implanted in the sidewalls of the deep trenches. The N-drift region is the portion of the substrate 125 that is located above the N+ doped bottom region 120 and below the transistors cells. For ideal operation, the P=N=1E12 atoms per cubic centimeter is the target charge. The more flexible the control of the electrical charges in the manufacturing processing by controlling the implant dosages, implant annealing, substrate doping concentration, epitaxial dopant concentration, trench depth, width and shape, and the parameters of other processing steps, the more the structure of the device can be optimized and fine tuned to achieve a lower specific resistance for a given breakdown voltage.

The MOSFET transistor cells further include N type dopant implant regions 135-S along the gate sidewalls and N type dopant implant regions 135-B below the gate trench bottom. The sidewall and bottom dopant implant regions surrounding the gates 145 are applied to eliminated the sensitivity of the channel of the MOSFET device relative to the trench depth and the P-epitaxial dopant concentrations. This embodiment with the new structure is based on the consideration of forming a high-performance MOSFET structure inside the P-epitaxial layer grown on the N-type substrate. The epitaxial layer is grown with minimal or no etch-back of the P-epitaxial layer at all. For a MOSFET to function, it must have a source of the same conductivity as the drain, and a body, which has an opposite conductivity, as well as an accumulation region, which connects the channel to the drain. When a trench-gate vertical MOSFET structure is realized, the source is at the top with the channel formed in a body region below the source and along the sidewalls of the gate trenches. An accumulation region must be formed, between the body region and the drain. For a high-voltage structure with the new configuration as disclosed in this invention, it would be difficult to form a high-performance vertical trench-gate MOSFET when the P-epitaxial grown on the top horizontal surfaces of the N-substrate is very thick. With a thick P-epitaxial layer, the gate trenches would have to be deep in order to reach through to the N-drift drain region. A deep trench, combined with a thick P-body region, will result in a low-performance vertical DMOS structure because of the resulting long channel and high channel resistance. Therefore, in the embodiments of this new invention which deal with P-epitaxial layers which may have a greater thickness between one, to three µm relative to the typical depth of gate trenches generally in a range between 0.8 to 1.5 µm, additional dopant implants in the gate trench sidewalls and bottom are carried out. The additional dopant implants are to compensate the P-epitaxial region in the accumulation and drain regions in proximity to the gate trenches, in order to realize high performance vertical trench-DMOS devices. Therefore, the addition of the tilted and non-tilted implants in the gate trench prior to the fabrication of the MOSFET device is the gate trenches enables high-performance trench-gate MOSFET devices independent of the P-epitaxial layer thickness and dopant concentrations in these regions.

It should be noted that the embodiment of FIG. 3 shows a gate trench which reaches through the P-epitaxial layer, and therefore, the N-type implants may be selected to optimize the performance of the MOSFET, without the need to compensate completely the P-doped region, i.e., the P-epitaxial layer, on the gate trench sidewalls. Implant species can be preferably phosphorus as well as Arsenic or Antimony. Energy can be in the 50 KeV to 200 KeV range. Tilt angle should be zero for the bottom implant, and +/−5 to 15 degrees for the sidewall implants. Dose can be in the 1E11 to 1E13 range.

Figure 4:
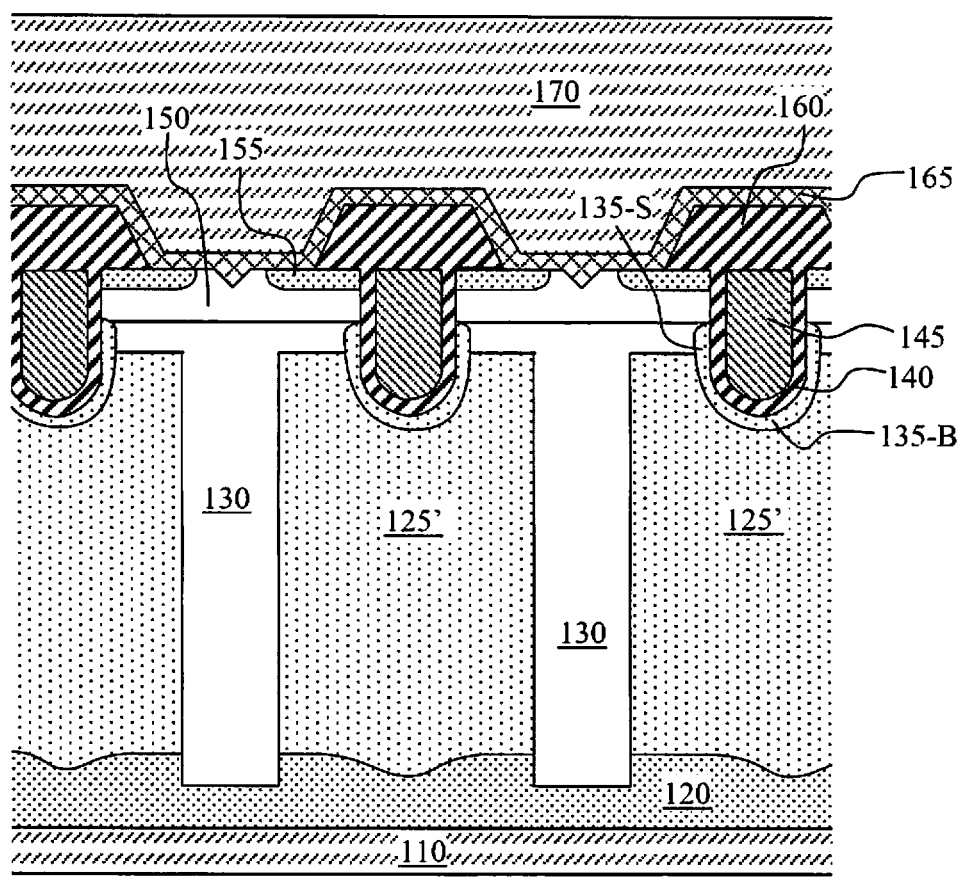

FIG. 4 is a cross sectional view to show an alternate embodiment of a MOSFET device similar to that shown in FIG. 3 except that the N-substrate regions 125' are not implanted with N dopant to achieve the charge control function through the manufacturing processes. This embodiment does not require the additional N-dopant regions for incorporation in the sidewalls of the deep trenches, because it is assumed that the doping concentration of the starting N-substrate is adequate to ensure charge balance with the grown P type epitaxial layer in the deep trenches. The doping concentration of the starting N-substrate is adequate when the actual value of the doping concentration can achieve the necessary charge balance, i.e., achieving the goal of having approximately absolute value of the N charge=P charge=1E12 atoms/cm$^3$. A dopant implant to carry out the charge control is not necessary when the substrate concentration can achieve the charge balance goals within the desired tolerance limits (for example, when the occurrences of N-substrate having adequate dopant concentration has better than +/−10% repeatability in the manufacturing processes).

Figure 5:
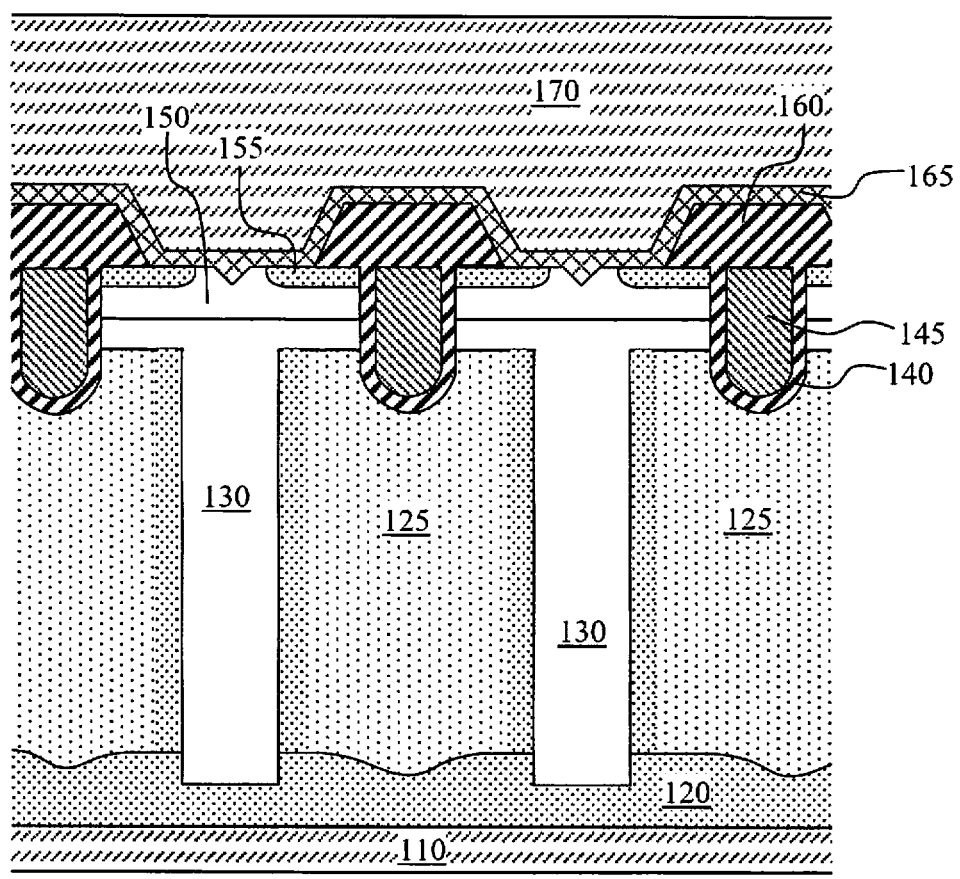

FIG. 5 is a cross sectional view to show an alternate embodiment of a MOSFET device similar to that shown in FIG. 3, except that the MOSFET device does not include a sidewall and trench bottom dopant implant regions 135-B and 135-S shown in FIG. 3. When the trench gates 145 have a greater depth and extend below the epitaxial layer 130 into the substrate region 125, and the epitaxial length isn't too long, the requirement for applying the trench sidewall and trench bottom dopant implant regions to eliminate the channel sensitivity to the depth of the trench gates are no longer necessary.

Figure 6:
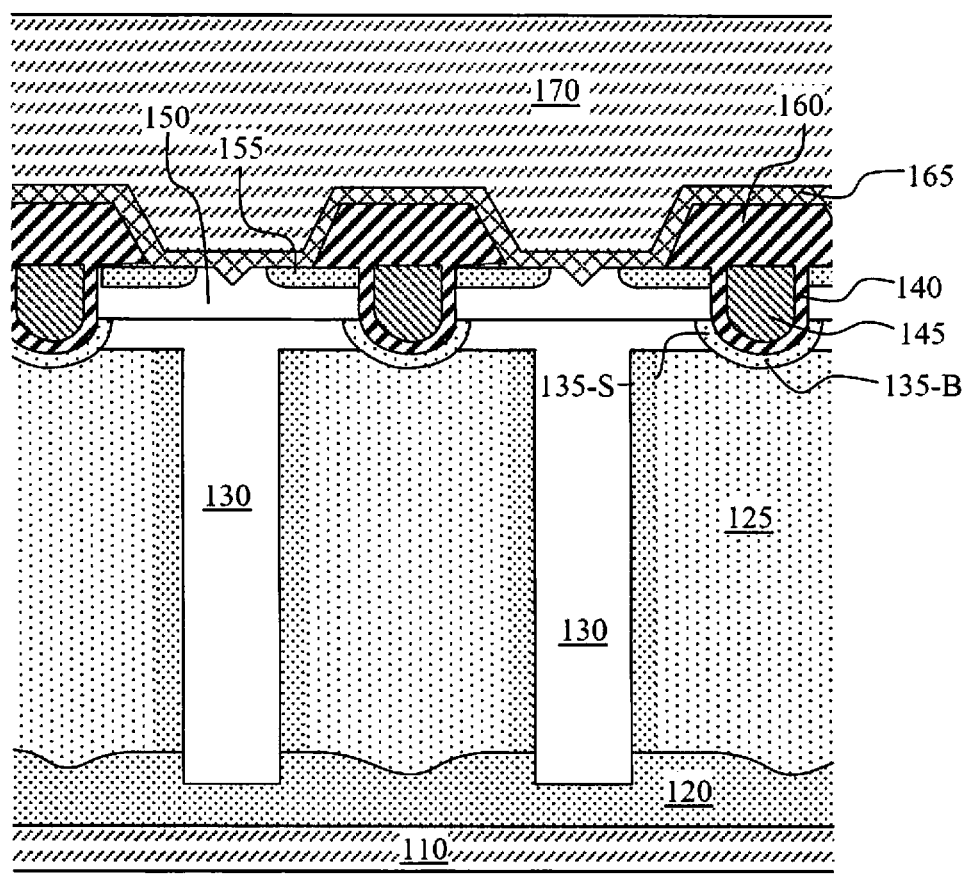

FIG. 6 is a cross sectional view to show an alternate embodiment of a MOSFET device similar to that shown in FIG. 3 except that the MOSFET device has shallower trench gates with a depth shallower than the epitaxial layer. The MOSFET device includes a gate trench sidewall and gate trench bottom dopant implant regions 135-B and 135-S to compensate the P-epitaxial layer 130 and to ensure that there are appropriate accumulation and channel regions. This embodiment is based on a configuration that the MOSFET device has a relatively thick P-epitaxial layers, or shallow gate trenches, or a combination of both. The gate trenches do not reach to the N drain region. In order to ensure proper and efficient transistor operations, the lower portion of the gate trenches must be doped N to ensure that there will be an accumulation region to connect the drain to the active channel formed in the body region along the sidewalls of the gate trenches.

Figure 7:
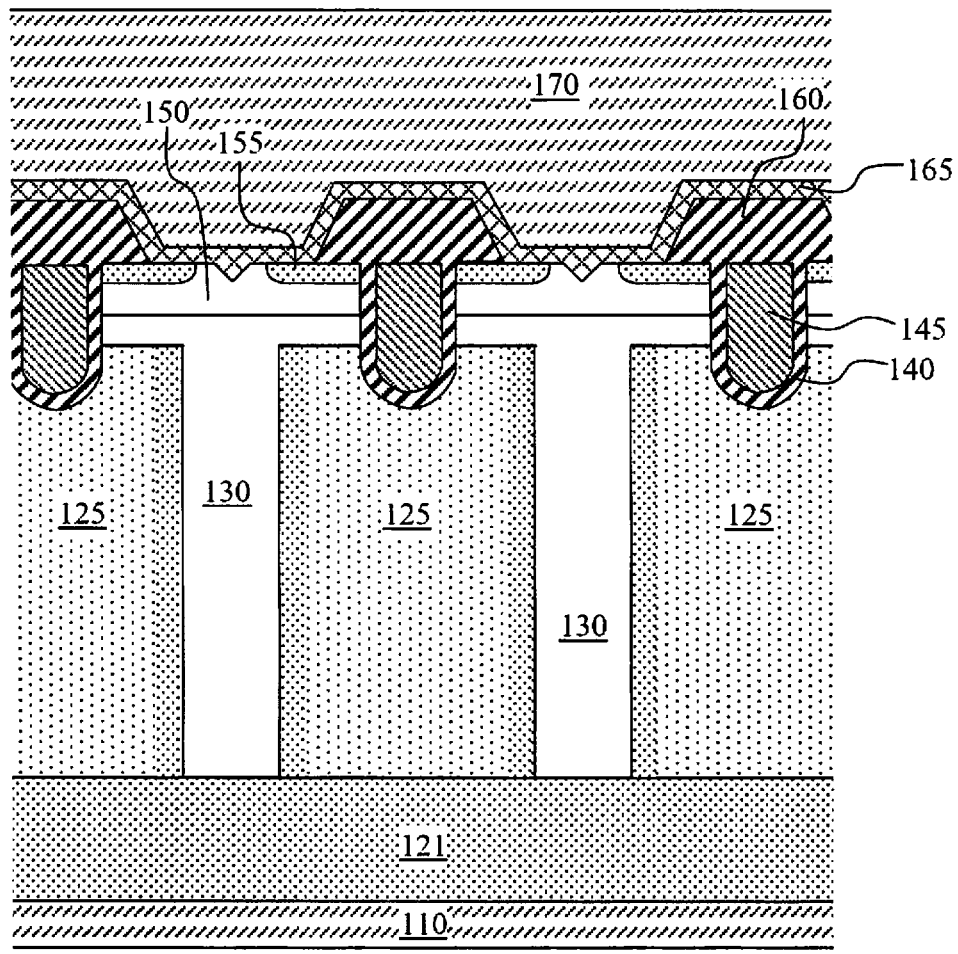

Conventional wafers have a heavily doped substrate, with lightly doped layer on top. However, the devices in FIGS. 1-6 were made from a plain wafer that did not initially have an epi-layer. This can save a considerable amount of the wafer costs, but requires extra steps of doping the bottom through the deep trench and back grinding the wafer. Alternatively, the device in FIGS. 7-8 uses a conventional wafer with a heavily doped N+ bottom substrate 121, and a less heavily doped N-type top substrate layer 126 grown over the N+ bottom substrate 121. In a conventional wafer, this N-type top substrate layer 126 is known as an epitaxial layer, however to avoid confusion, it is referred to in this application as a top substrate layer. FIG. 7 is a cross sectional view to show a MOSFET device similar to that shown in FIG. 3 except that the deep trenches 130 filled with P-epitaxial layer is now located in the N substrate layer 126 and extended to touch the highly doped. N+ bottom substrate region 121. A separate drain contact region 120 of FIG. 3 formed by a separate dopant implant process is no longer required. Instead, a highly doped bottom substrate region 121, (N+ for N-channel device) with an N-type top substrate layer 126 grown on top of this bottom substrate 121 (which is the standard semiconductor wafer configuration used for most vertical Power devices), is used for this embodiment. The top substrate region can be thin compared to the epitaxial layer of conventional wafers, thus saving cost. A backside grinding might not be required for this embodiment. A metal drain electrode 110 is to be formed beneath the highly doped substrate region 121.

The drain contact dopant implant process (at the bottom of the deep trenches) is eliminated, which reduces the number of processing steps compared to earlier embodiments.

Figure 8:
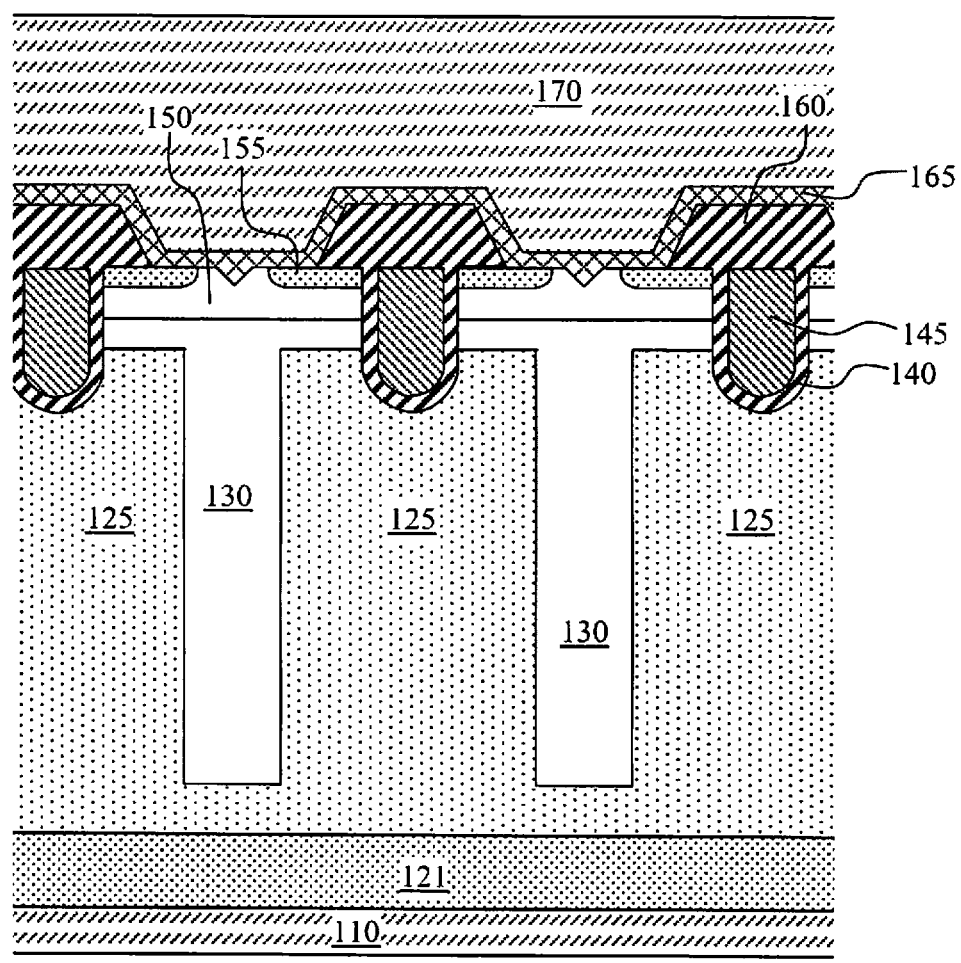

FIG. 8 is a cross sectional view to show an alternate embodiment of a MOSFET device similar to that shown in FIG. 7 except that the deep trenches 130 filled with P-epitaxial layer is now at a depth that is shallower than the highly doped N+ bottom substrate 121 which connects to metal drain electrode 110.

Figure 9A:
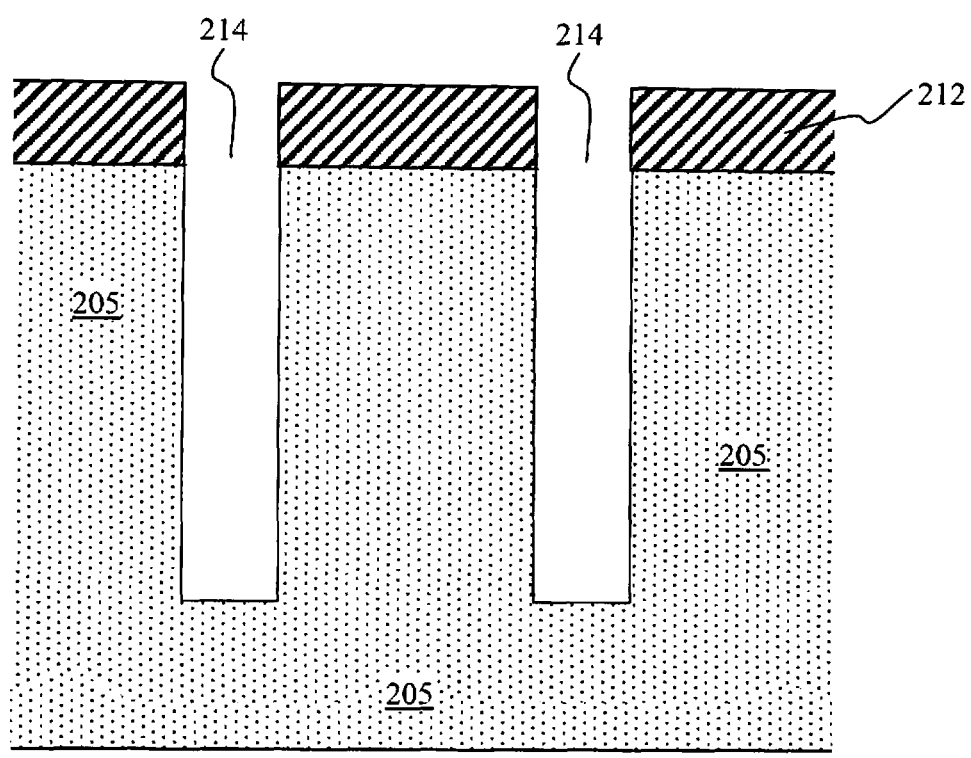
FIGS. 9A to 9M are a cross sectional views to illustrate processing steps of this invention to manufacture high voltage power device of FIG. 2 with super junction structures.
Figure 9B:
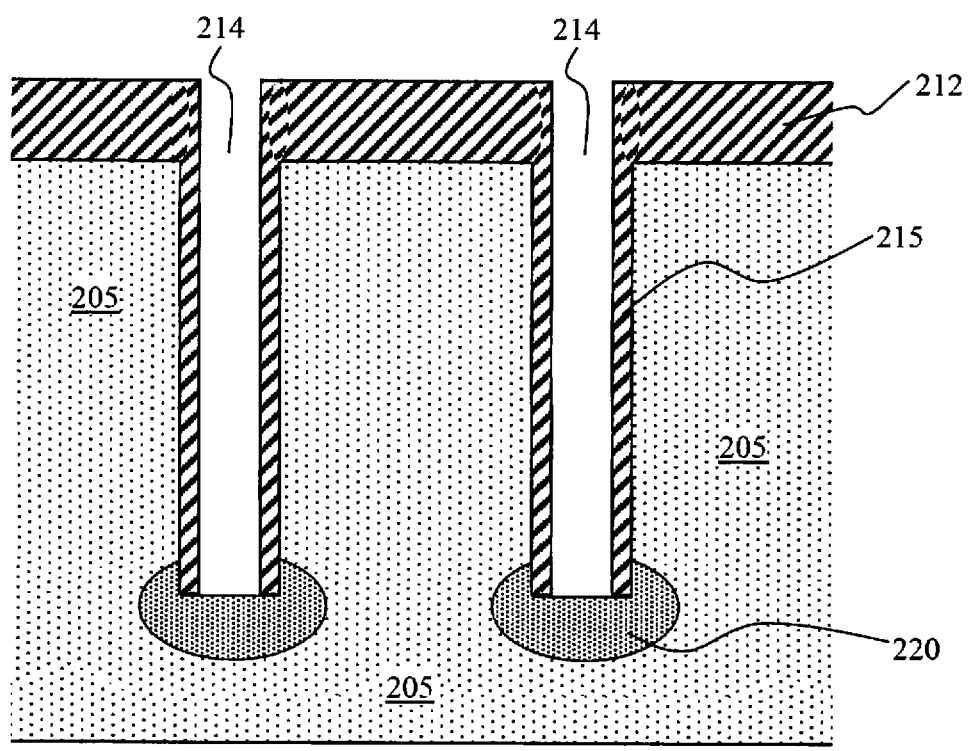

Referring to FIGS. 9A to 9M for a serial of side cross sectional views to illustrate the fabrication steps of a charge balanced semiconductor power device as that shown in FIG. 2. FIG. 9A shows a starting silicon substrate includes an N substrate 205 having a resistivity approximately 10 ohm/cm. The N substrate 205 initially has no epitaxial layer. A hard mask oxide layer 212 is deposited or thermally grown with a thickness of 0.1 to 1.5 micrometer. Then a trench mask (not shown) with a critical dimension (CD) in a 1 to 5 microns range, is applied to carry out an oxide etch to open a plurality of trench etching windows followed by removal of the photoresist. A silicon etch, is carried out to open deep trenches 214 with a depth of 40 to 50 microns for devices operated at a voltage of about 650 volts. Depending on the type etcher and etch chemistries, a photoresist only mask may also be used to pattern and open the trench as well instead of using the hard mask oxide layer 212 as shown. The trench opening may be in the 1 micron to 5 microns range preferably 3 microns for most applications (the trench opening being defined by the trench mask mentioned earlier). Then a wafer clean process is performed. In FIG. 9B, a conformal oxide layer 215 is formed by either an oxide deposition or thermal growth process. Then an optional RIE anisotropic etch is carried out to clear the oxide from the bottom of the trench bottom surface if the oxide layer is thicker on the bottom surface. The thickness of the oxide layer 215 is between 0.015 to 0.1 micron, when the process does not include the optional RIE step and the layer thickness of the oxide layer 215 is between 0.1 to 0.4 micrometers when the processes include the optional RIE step. A drain contact implant is performed by implanting N+ ions along a zero tilt angle relative to the sidewalls of the trenches, i.e., a vertical implant, having an implant dosage greater than 1E15 to form the drain contact regions 220 immediately below the deep trenches 214. The drain contact region 220 may be implanted with N ions such as phosphorus or arsenic ions. The oxide layer 215 along the sidewalls protects the sidewalls from the high dosage of the drain contact implant.

Figure 9C:
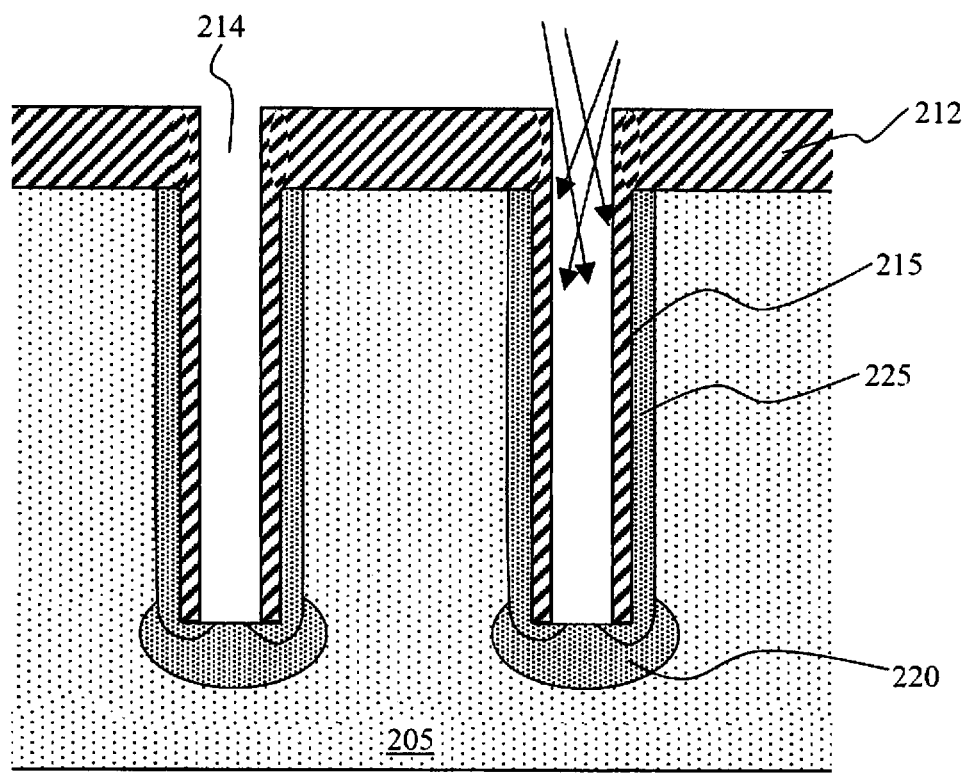
Figure 9D:
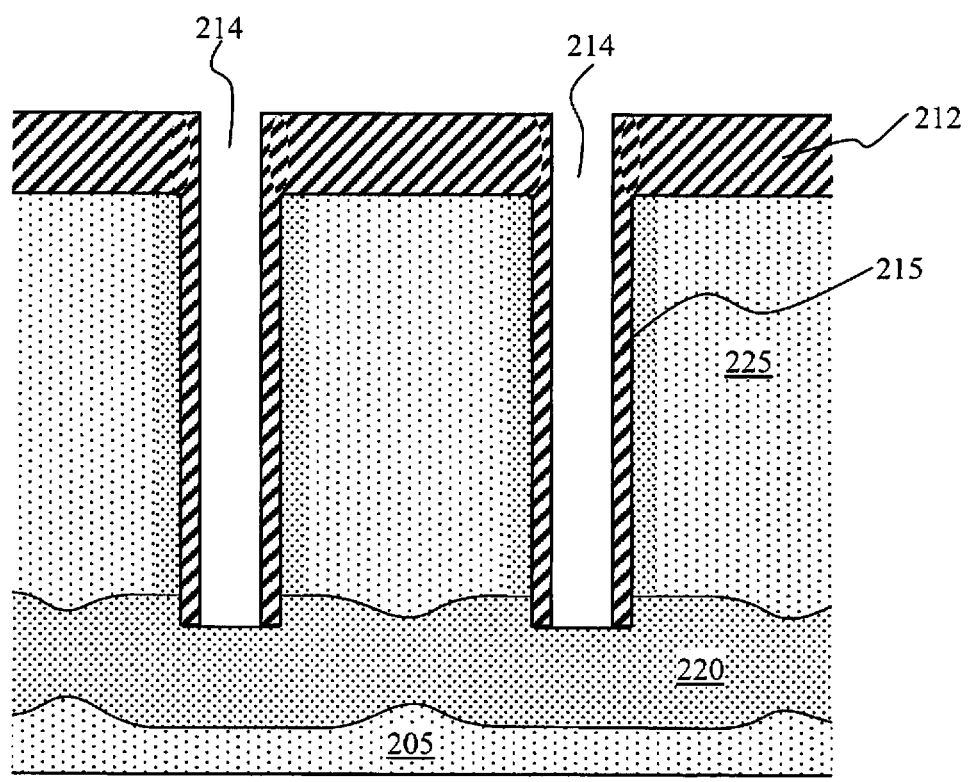
Figure 9E:
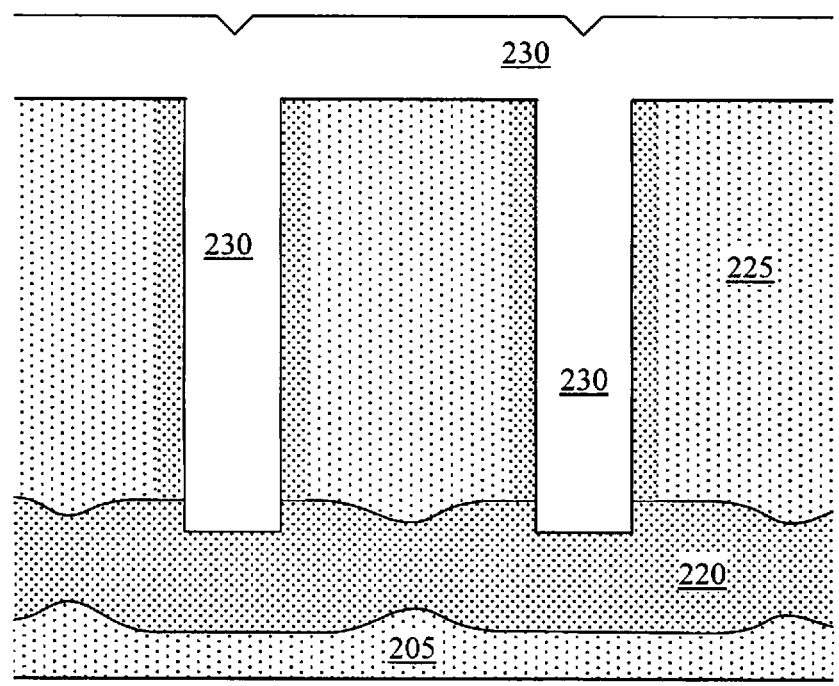
Figure 9F:
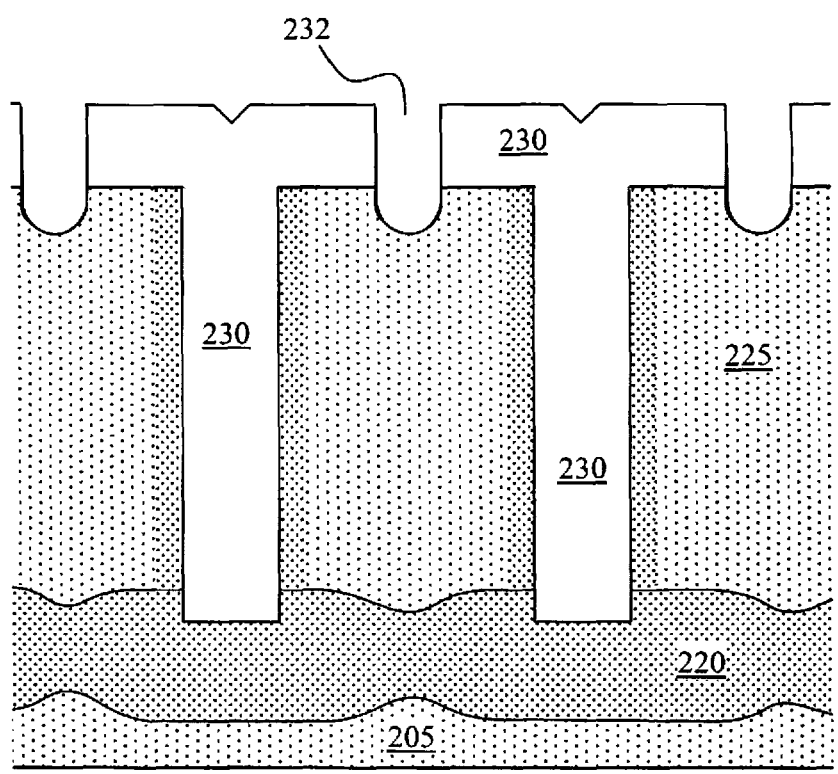

In FIG. 9C, a trench sidewall implant is carried out With N-type ions such as phosphorous ions to set the doping concentration in the N regions. An implant with tilted angle and rotated operations are performed with a dosage of 5E11 to 2E13 and a tilt angle of five to fifteen degrees are carried out to form the N-regions 225 between the trenches depending on the trench depth. In FIG. 9D, a high temperature anneal operation at 1050 to 1200 degrees Celsius for 30 to 60 minutes with low oxygen (O2) and/or N2 is applied to diffuse the N+ drain contact region 220 and also to laterally diffuse the sidewall implant N-regions 225. The N-regions 225 now form a lateral N-type concentration gradient, with the concentration being greatest near the deep trench side walls. The sidewall implants may be used to adjust the N-type concentration of the regions of the substrate 205 that are along a lateral direction relative to the deep trenches in order to achieve a charge balance (super-junction effect) with the P-epitaxial layer 230 (about to be grown). Alternatively to the sidewall implants, the substrate 205 can be initially formed with the required N-type concentration to achieve the super junction effect. In FIG. 9E, the oxide layers 212 and 215 are etched off and a P-epitaxial layer 230 with a P dopant concentration of 1E15 to 1E16 or higher, is grown (depending on the desired breakdown voltage). The thickness of the P-epitaxial layer 230 is sufficient to fill the trenches 214. For a trench 214 with a width of about 3 microns, the thickness of the epitaxial layer 230 over the top of the N-region 225 is approximately 1.5 to 2.0 microns. In FIG. 9F, an oxide layer is deposited with a thickness of about 0.5 to 1.5 microns as hard-mask layer (not shown) followed by applying a gate trench mask (not shown) to etch the hard-mask oxide layer then removing the photoresist. The width of the gate trench may be of the order of 0.4 to 1.5 micron typically. A silicon etch is carried out to etch the trench gate openings 232 through the P-epitaxial layer 230 with a trench depth of about 1 to 2.5 microns that penetrates through the P-epitaxial layer 230 into the N-dopant regions 225 between the epitaxial columns 230 deposited into the trenches 212. The processes then followed with wafer cleaning and optionally a round hole etch to smooth the gate trench profile followed by another wafer cleaning process.

Figure 9G:
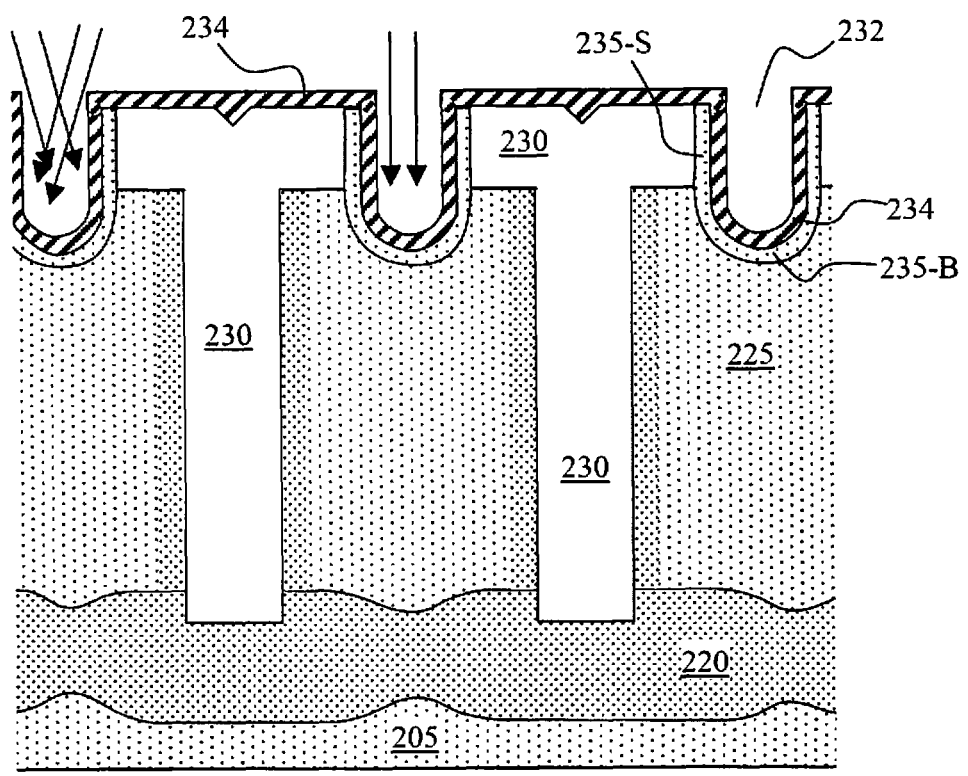
Figure 9H:
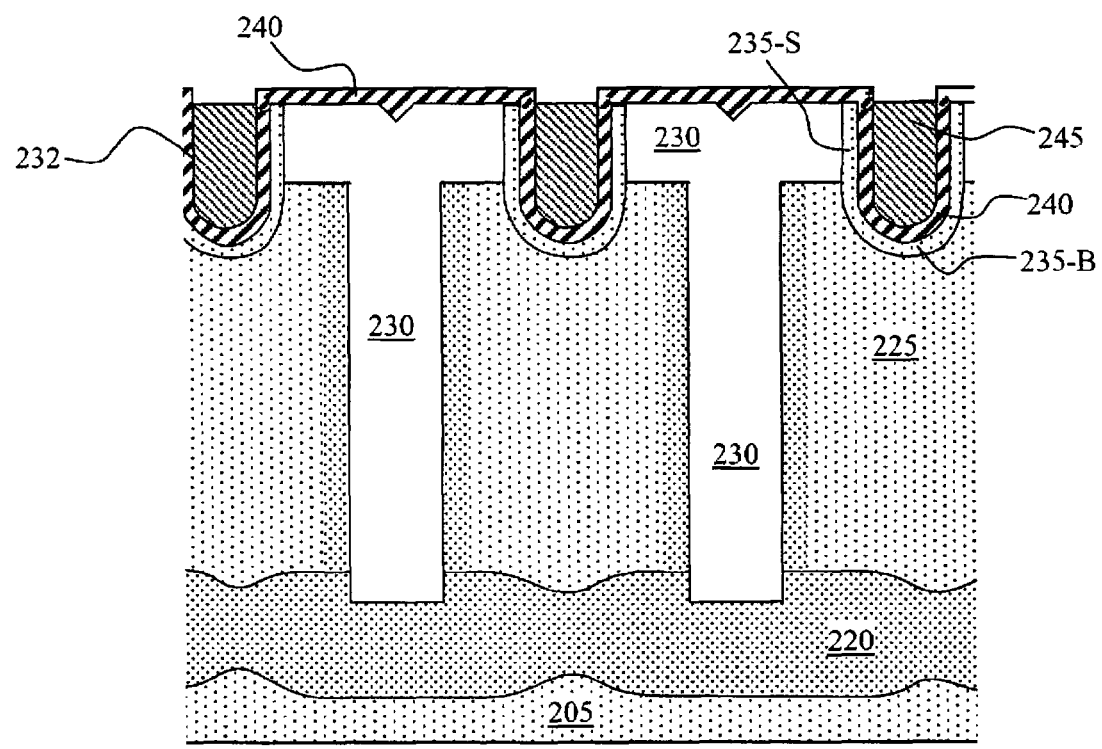

In FIG. 9G, the oxide hard mask is removed followed by depositing a thin screen layer 234 covering the sidewalls and the bottom surface of the gate trenches 232. Optionally, a trench sidewall-implant with a +/−7 degrees tilt implant angle is carried out to compensate the P-epitaxial layer 230 followed by a trench bottom implant with zero tilt angle to compensate the P-epitaxial layer 230 if the gate trench 232 is too shallow. The implants into the gate trench sidewalls and the bottom surface to form the sidewall and bottom dopant regions 235-S and 235-B respectively is to eliminate the sensitivity of the channel of the MOSFET device relative to the depth of the trench gates and the doping concentration of the P-epitaxial layer 230. In FIG. 9H, the screen oxide layer 234 is removed and a thermal gate oxide layer 240 is grown having a thickness of 0.01 to 0.1 micron depending on the device voltage rating. A gate polysilicon layer 245 is deposited into the gate trenches 232. The gate polysilicon layer 245 is preferably performed with in-situ N+ doping and the polysilicon layer 245 is doped by ion implantation or diffusion, if the polysilicon layer 245 is not in-situ N+ doped. The gate polysilicon layer 245 is etched back from the top surface surrounding the trenched gates 245.

Figure 9I:
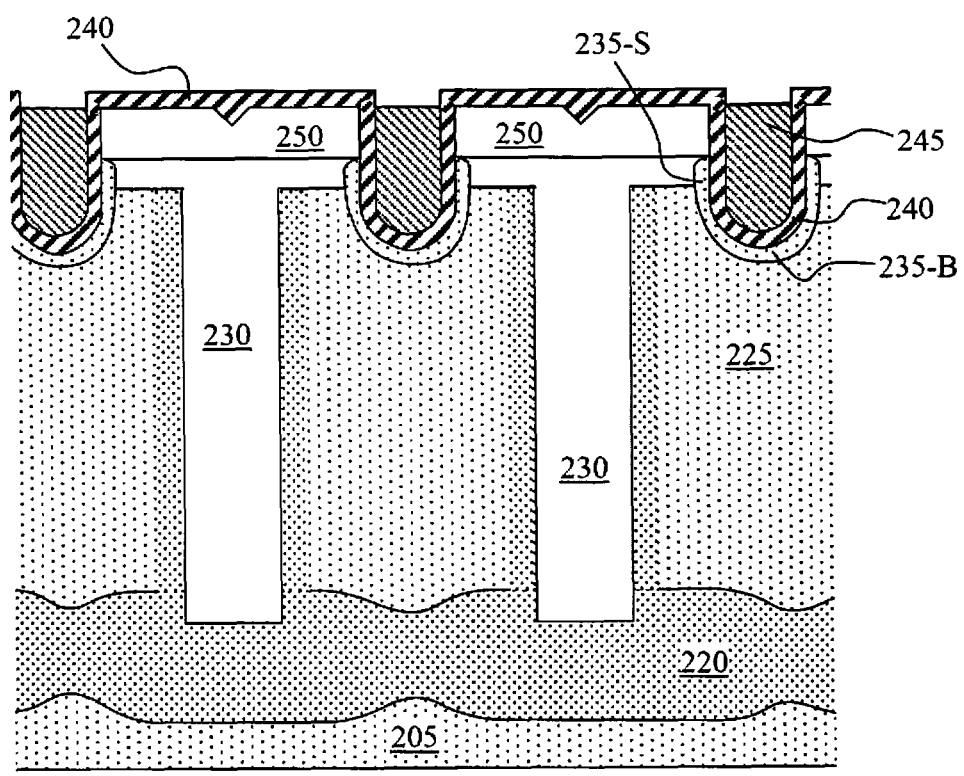
Figure 9J:
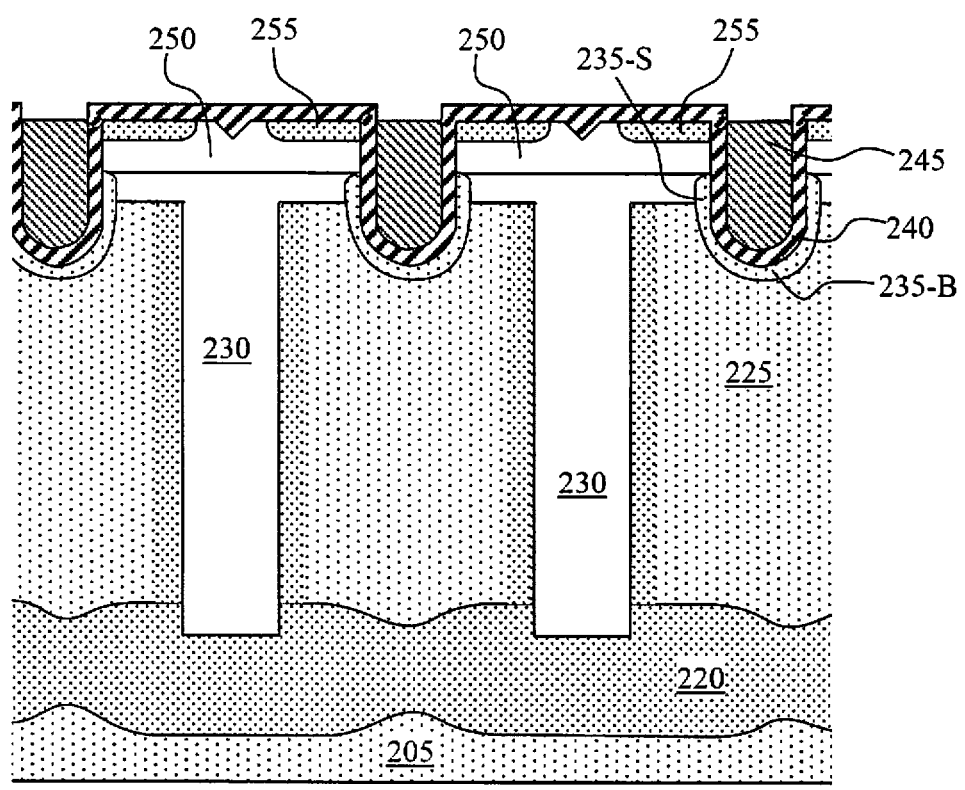
Figure 9K:
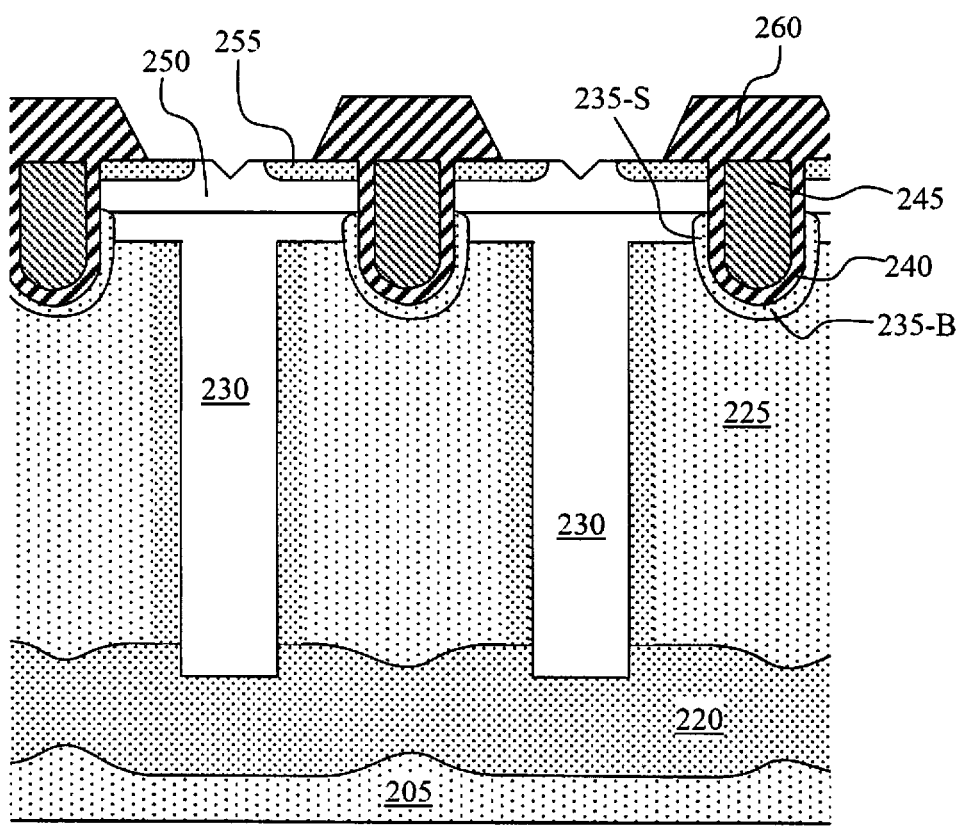
Figure 9L:
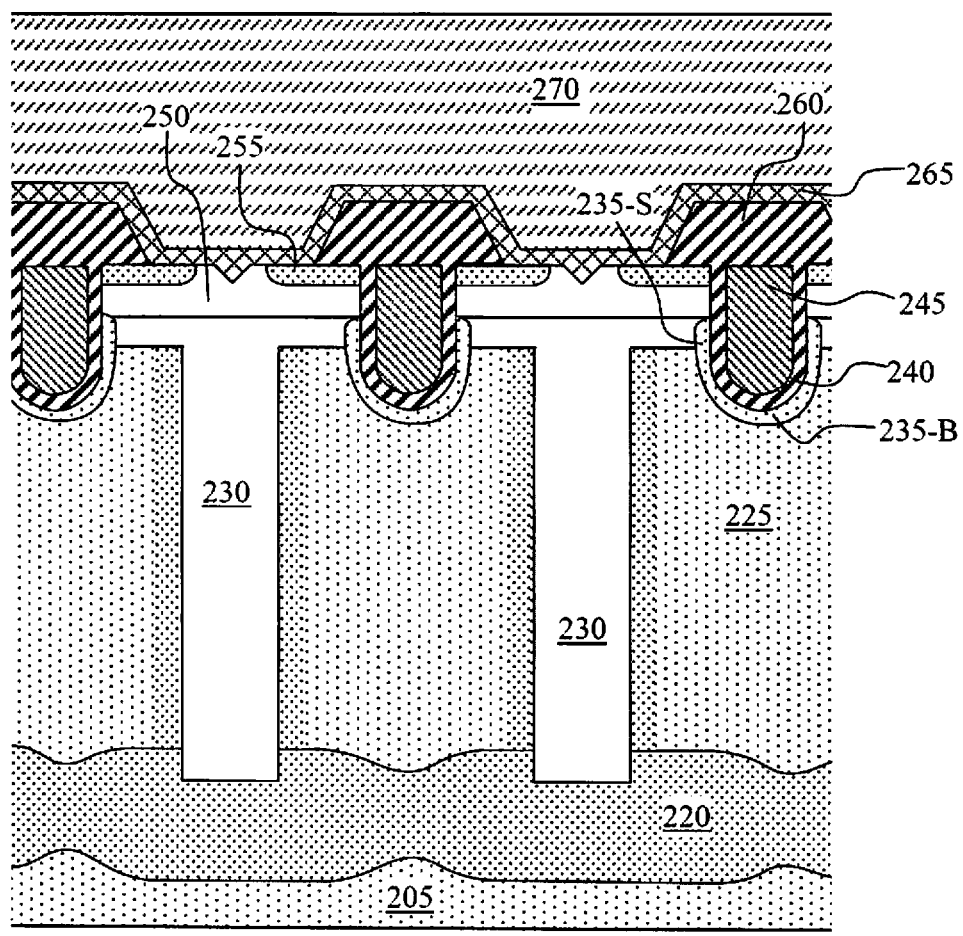
Figure 9M:
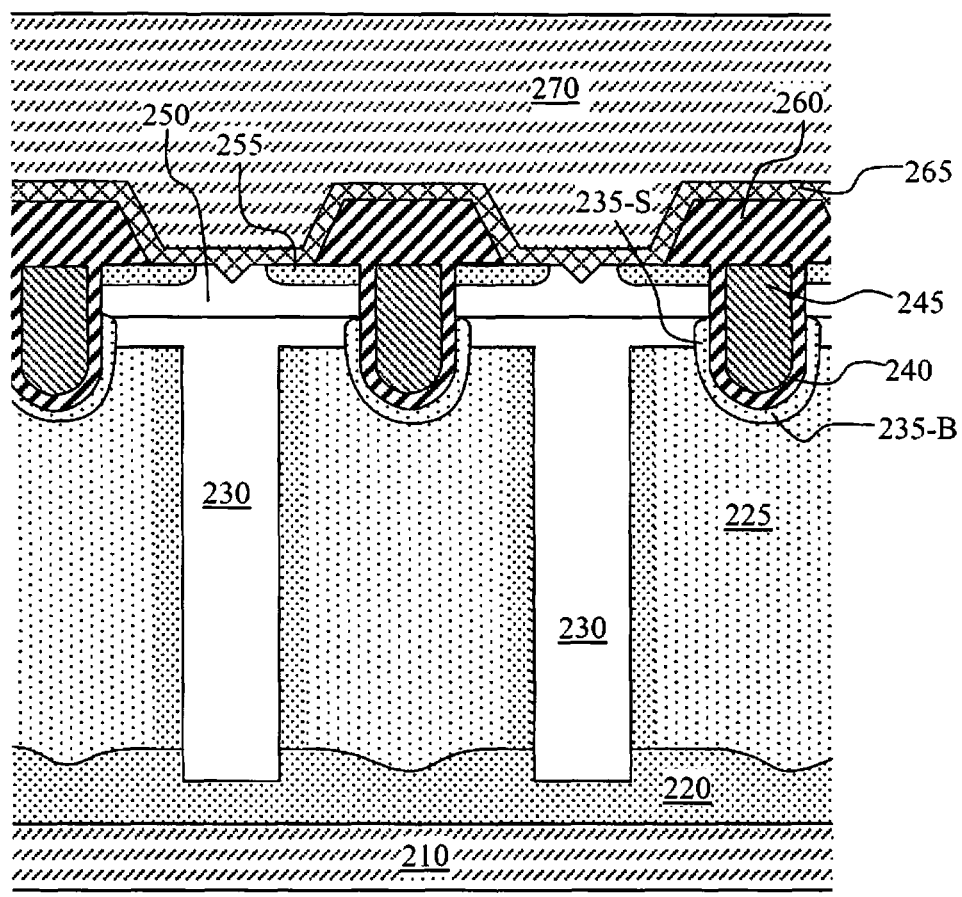

In FIG. 9I, an optional body mask (not shown) is applied to carry out a body implant with boron for a NMOS device having a dosage ranging from 3E12 to 1E14 followed by a body drive process at a temperature of 1000 to 1150 degree Celsius to form the P-body regions 250 in the epitaxial layer 230 surrounding the trench gates 245. In FIG. 9J, an optional source mask (not shown) is applied to carry out a source dopant implant. The source implant mask is optionally applied to protect the locations to form the P-body contact. The source implant is carried out with source dopant ions such as arsenic ions with a dosage about 4E15 at an energy about 70 KeV at a zero degree tilt followed by a source anneal operation at a temperature of approximately 800 to 950 degrees Celsius to diffuse the source regions 255. In FIG. 9K, a dielectric layer 260 that by a Low Temperature Oxide deposition (LTO) and BPSG layer is formed to the top surface followed by a BPSG flow process. Then a contact mask (not shown) is applied to carry out an oxide etch to etch the contact openings through the BPSG layer 260. A P+ body contact implant is carried out as an optional step followed by a reflow after the body contact implant. In FIG. 9L, a barrier metal deposition is carried out to cover the top surface with a barrier metal layer 265 followed by a thick metal deposition to form the source metal layer 270. A metal mask (not shown) is applied to etch and pattern the source metal and gate connection metallization. The processes are completed with the deposition of dielectric layers to passivate the device surface, and the patterning of the passivation layer to form the bond, pad openings (not shown). A final alloy can then be performed. For the sake of brevity, these standard manufacturing processes are not specifically described here. In FIG. 9M, a backside grinding operation is carried out to remove the low doped portion of the substrate 205 from the bottom surface of the substrate then a back metal layer 210 is formed to contact the drain region 220 where the dopant concentration is higher. The back metal layer 210 may be formed by a deposition of TiNiAg layer directly on the backside of the wafers (below the drain region 220). The back grinding operation has a thickness control with a few microns and even down to one micron thus enables a reliable backside contact to form the drain electrode layer 210 to contact the N+ drain regions 220 near the bottom of the substrate 205.

Figure 10A:
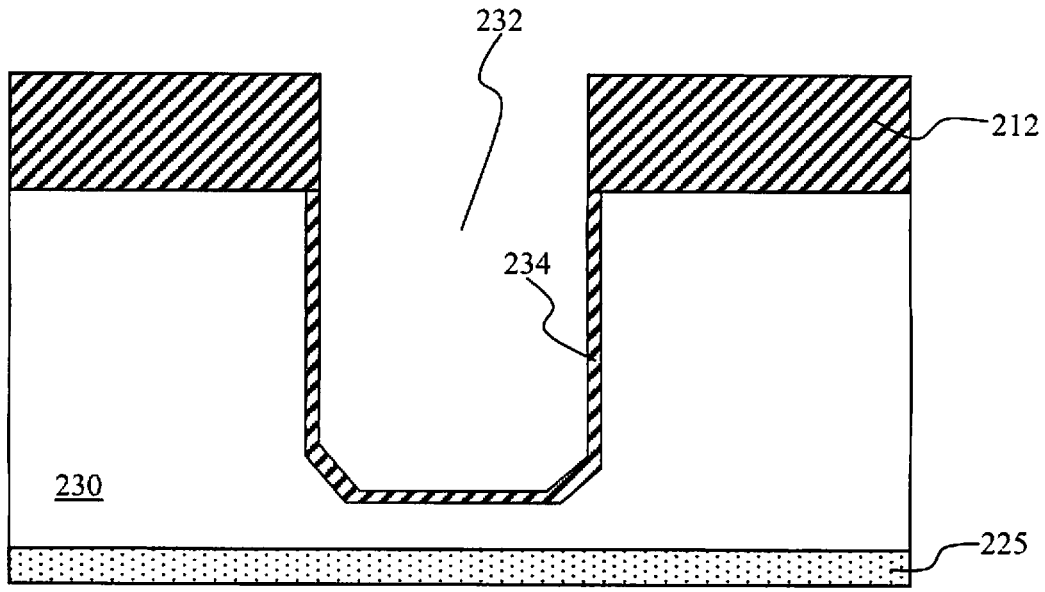
FIGS. 10A to 10D are cross sectional views to illustrate processing steps of this invention to manufacture super-junction power device of with shallower trenches.
Figure 10B:
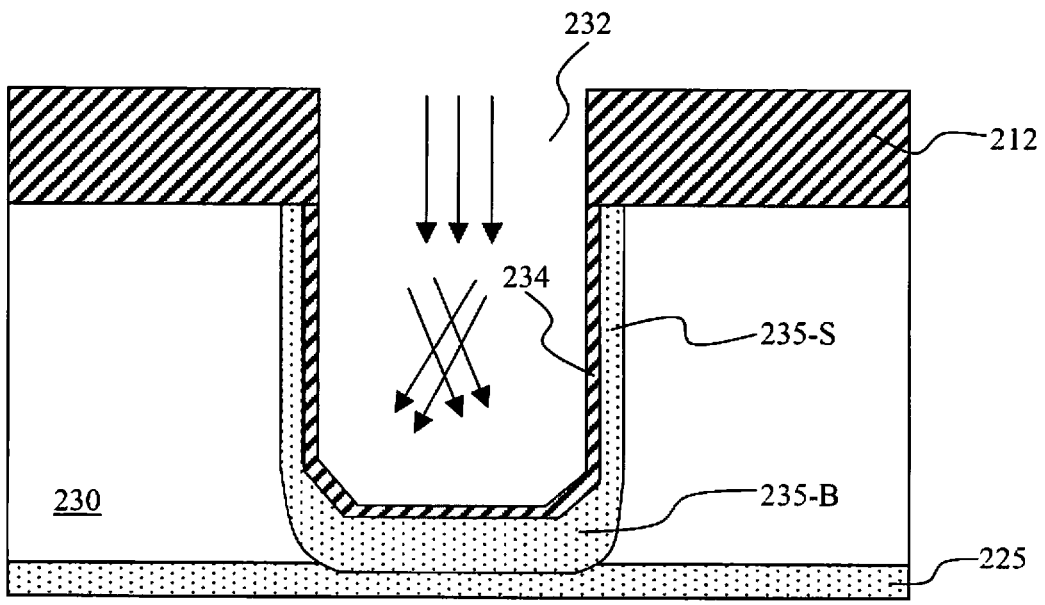
Figure 10C:
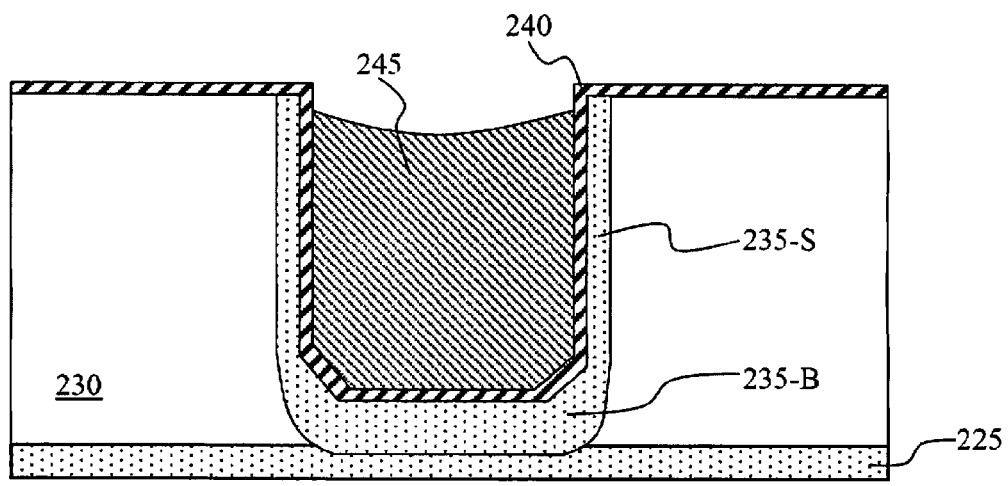
Figure 10D:
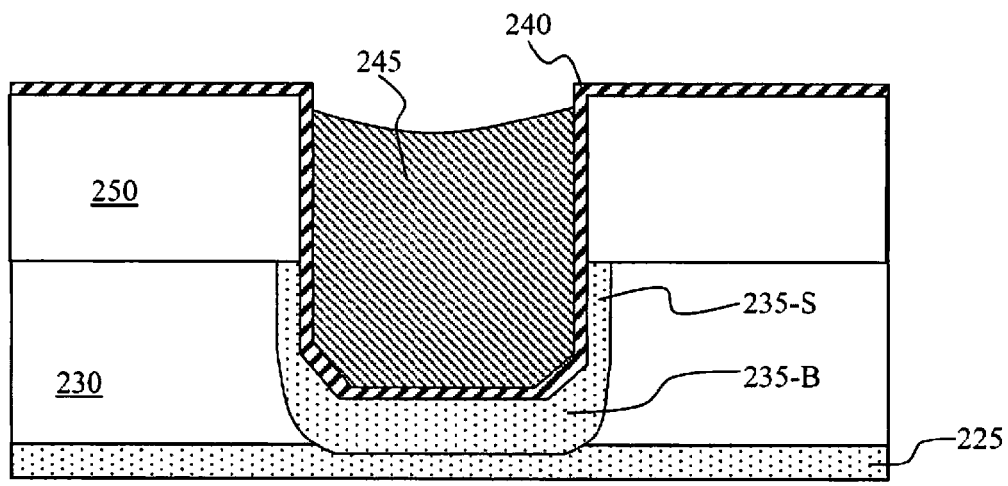

Referring to FIGS. 10A to 10D for a series of cross sectional views for illustrating some of the processing steps in fabricating the MOSFET device with trench gates that have depth shallower the P-type epitaxial layer 230. The processing steps as that shown in FIGS. 9A to 9F are similarly applied with the gate trenches 232 opened in the epitaxial layer 230 surrounded by oxide hard mask layer 212. The gate trenches 232 are shallower than the thickness of the epitaxial layer 230. The bottom surface of the gate trenches 232 is above and at a distance from the N substrate 225. The process is then followed with wafer cleaning and optionally a round-hole etching process to smooth the gate trench profile followed by another wafer cleaning process. A thin layer of screen layer 234 is deposited on the sidewalls and the bottom surface of the gate trenches 232. In FIG. 10B, a trench sidewall sidewall-implant with a +/−7 degrees tilt angle coordinated with rotational implant is carried out optionally to compensate the P-epitaxial layer 230 followed by a trench bottom implant with zero tilt angle to compensate the P-epitaxial layer 230 due to the shallow gate trench 232. The implants into the gate trench sidewalls and the bottom surface to form the sidewall and bottom dopant regions 235-S and 235-B respectively is to eliminate the sensitivity of the channel of the MOSFET device relative to the depth of the trench gates and the doping concentration of the P-epitaxial layer 230. The thick oxide hard mask 212 protects the top surface from gate trench implant. In FIG. 10C, the screen oxide layer 234 is removed and a thermal gate oxide layer 240 is grown having a thickness of 0.01 to 0.1 micron depending on the device rating. A gate polysilicon layer 245 is deposited or grown into the trenches 232. The gate polysilicon layer 245 is preferably performed with in-situ N+ polysilicon and the polysilicon layer 245 is doped by ion implantation if the polysilicon layer 245 is not in-situ N+ doped. The gate polysilicon layer 245 is etched back from the top surface surrounding the trenched gates 245. In FIG. 10D, an body mask (not shown) is optionally applied to carry out a body implant with boron for a NMOS device having a dosage ranging from 3E12 to 1E14 followed by a body drive process at a temperature of 1000 to 1150 degree Celsius to form the P-body regions 250 in the epitaxial layer 230 surrounding the trench gates 245. The accumulation region and channel region are formed surrounding and beneath the trench gate 245 even though the trench gate 245 is shallower than the thickness of the P-epitaxial layer 230. Subsequent processing steps such as that shown in FIGS. 9J to 9M are carried out to complete the fabrication processes of the MOSFET device.

Figure 11:
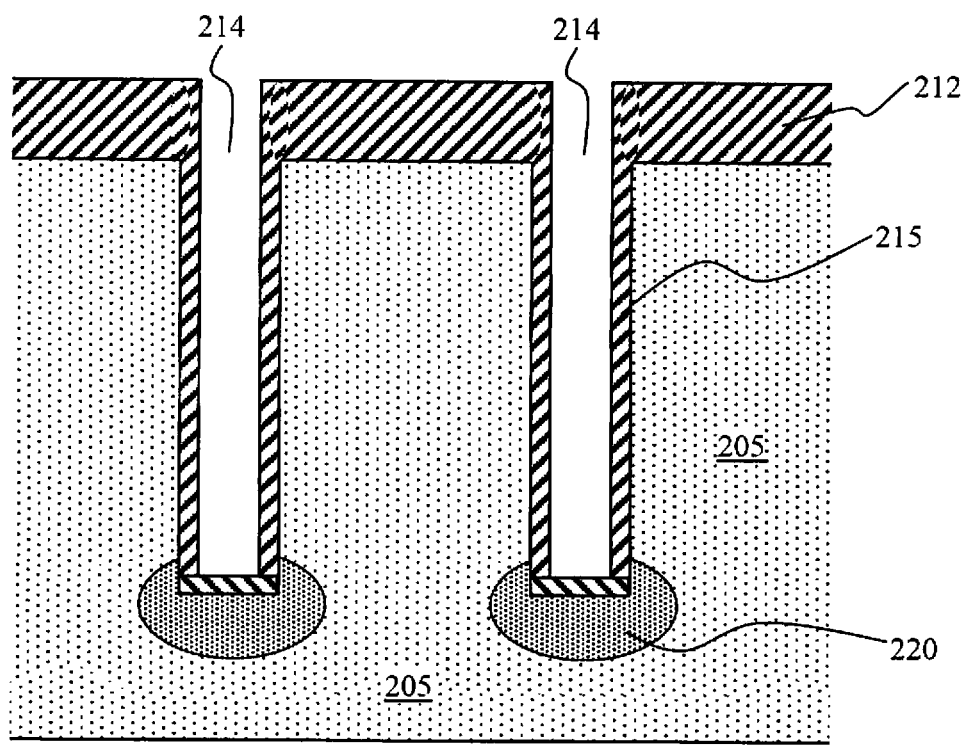
FIG. 11 is a cross sectional view to illustrate a zero tilt implant process to form the drain contact regions below the deep trenches filled with an epitaxial layer of this invention.

FIG. 11 shows an alternate processing step that is different from the processing step shown in FIG. 9B. FIG. 11 shows the step of deposition of an oxide layer 215 or a thermal growth of a conformal oxide layer 215 by applying a High Temperature deposited Oxide (HTO) process. The processes then skip the step of a RIE anisotropic etch of the screen oxide in bottom of the deep trenches during the deep trench implant steps. A drain contact implant is performed by implanting N+ ions along a zero degree tilt angle relative to, the sidewalls of the trenches having an implant dosage greater than 1E15 and an implanting energy adjusted to penetrate the bottom oxide layer to form the drain contact regions 220 immediately below the deep trenches 214. The drain contact region 220 may be implanted with N ions such as phosphorus or arsenic ions. The oxide layer 215 along the sidewalls protects the sidewalls from the high dosage of the drain contact implant. Compared to the device shown in FIG. 9B, this embodiment has the advantages that it is not required to carry out an etch-back step to remove the oxide at the bottom of the deep trenches, the manufacturing processes are simplified and the production cost is reduced.

Referring to FIGS. 12A to 12M for a serial of side cross sectional views to illustrate the processing steps for manufacturing a charge balanced semiconductor power device as another exemplary embodiment of this invention. The purpose of the processing steps is to provide a simplified device from the above embodiments. As will be further described below, the ion implantation at the bottom of the deep trenches, as well as a high temperature anneal process to form a low resistance drain contact diffusion at the bottom of the structure, is not required since a highly doped substrate (with a grown N-epi on top) is used instead of a "bulk" wafer with uniform N doping. As discussed earlier, the term "top substrate layer" is used instead of "epitaxial layer" for the starting silicon substrate, to avoid confusion.

Figure 12A:
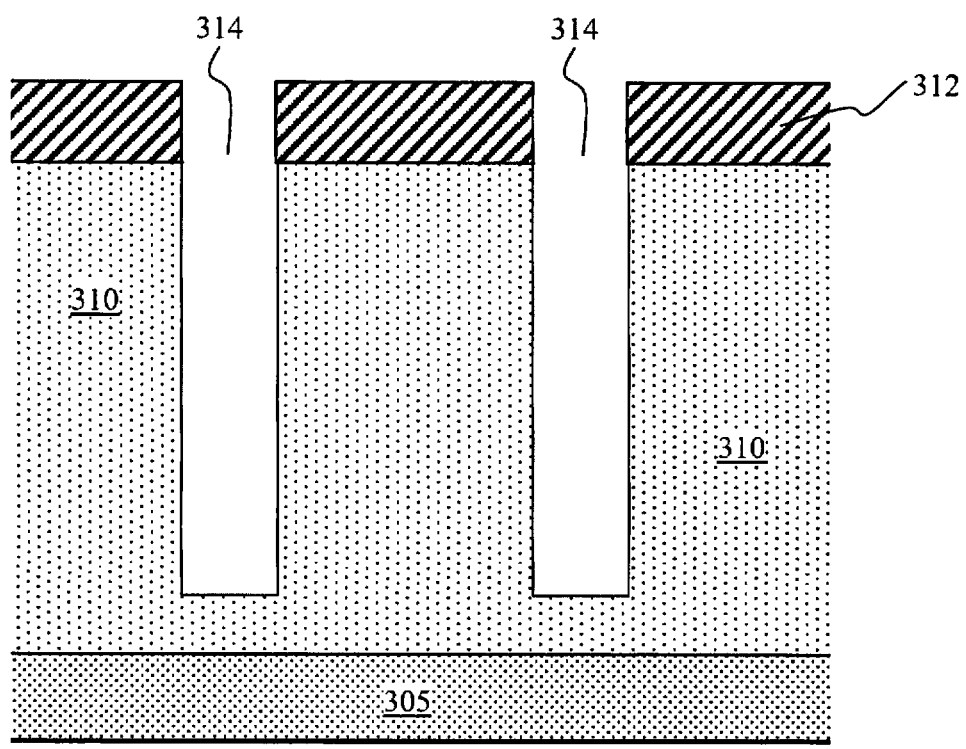
FIGS. 12A to 12M are a series of cross sectional views to illustrate processing steps of this invention to manufacture another exemplary embodiment of a charge-balanced power device with super junction structure of this invention.
Figure 12B:
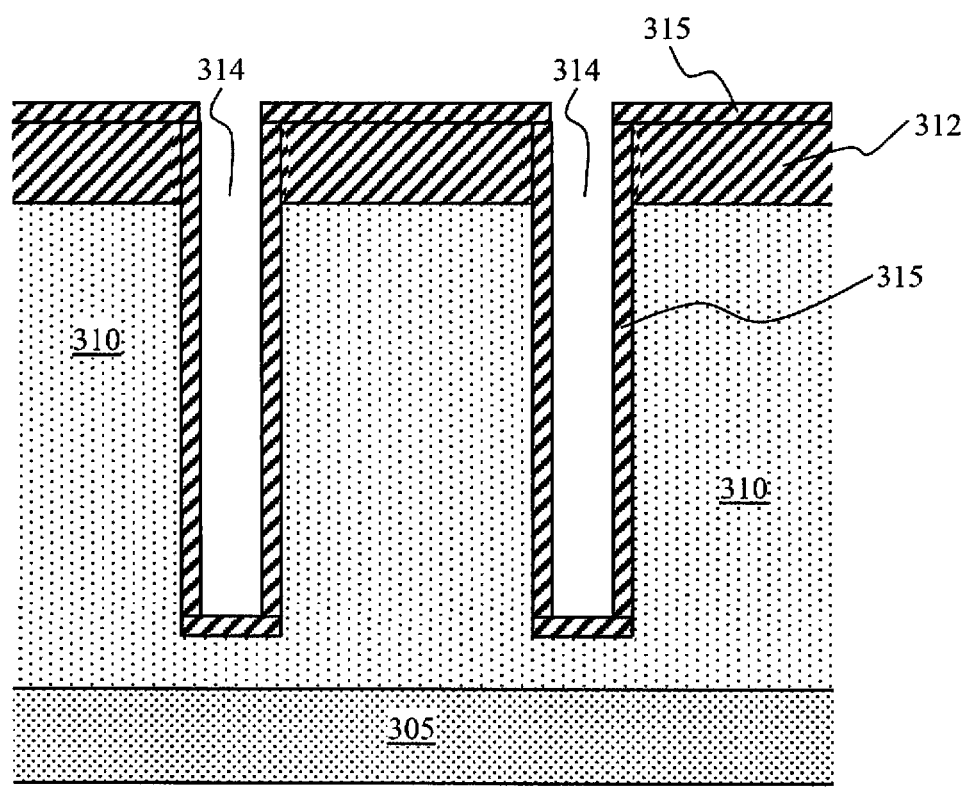

FIG. 12A shows a starting silicon substrate comprises an N+ CZ bottom substrate 305 supports an N top substrate layer 310 grown on top of it. The N+ bottom substrate 305 is preferably a substrate with a resistivity in a range between 0.003 to 0.005 ohm/cm and the N top substrate layer 310 for NMOS has a thickness that is dependent on the breakdown voltage. For a device having a breakdown voltage approximately 600 volts or higher, a top substrate layer 310 having a thickness of 45 to 55 mm is used. A hard mask oxide layer 312 is deposited or thermally grown with a thickness of 0.1 to 1.5 micrometer. Then a trench mask (not shown) with a critical dimension (CD) in a 1 to 5 microns range (preferable 3.0 microns), is applied to carry out an oxide etch to open a plurality of trench etching windows followed by removal of the photoresist. A silicon etch is carried out to open deep trenches 314 in the N top substrate layer 310 with a depth of 40 to 50 microns for devices operated at a voltage of about 650 volts. Depending on the type etcher and etch chemistries, photoresist only mask may also be used to pattern and open the trench as well instead of using the hard mask oxide layer 312 as shown. The trench opening may be in the 1 micron to 5 microns range preferably 3 microns for most applications. Then a wafer cleanup process is performed. In this embodiment, the trenches do not reach the bottom substrate 305. In an alternative embodiment the trenches may be etched down to reach the bottom substrate 305. In FIG. 12B, a conformal oxide layer 315 is formed by either an oxide deposition or thermal growth process. Then an optional RIE anisotropic etch is carried out to clear the oxide from the bottom of the trench bottom surface if the oxide layer is thicker on the bottom surface. The thickness of the oxide layer 315 is between 0.015 to 0.1 microns when the process does not include the optional RIE step and the layer thickness of the oxide layer 315 is between 0.1 to 0.4 micrometers when the processes include the optional RIE step.

Figure 12C:
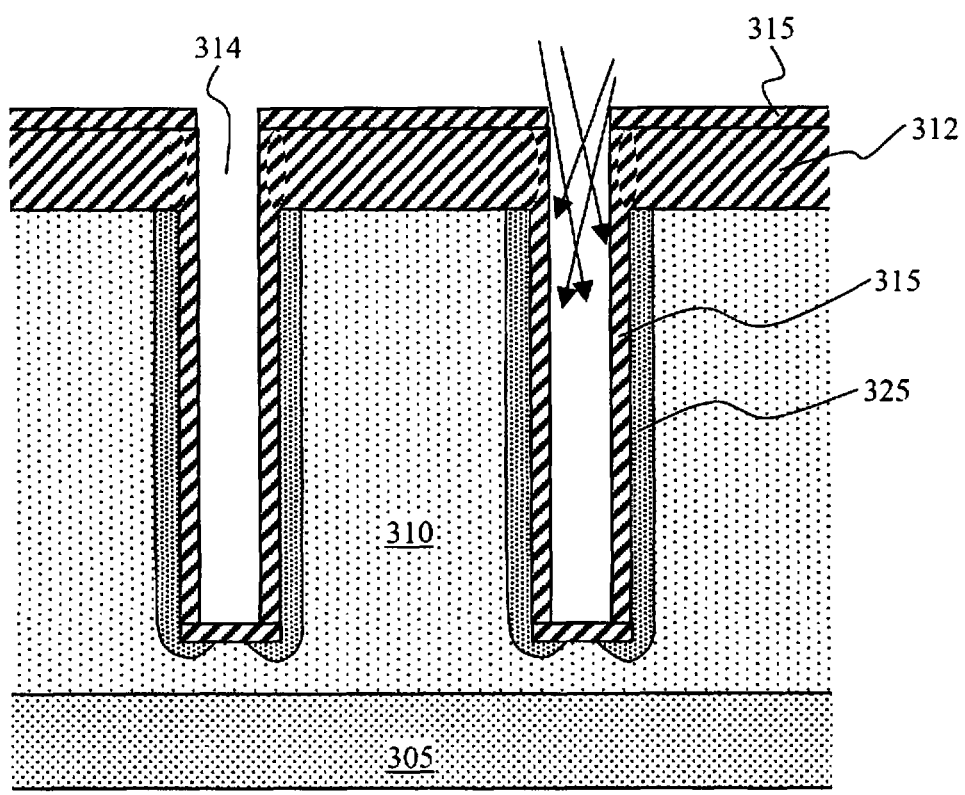
Figure 12D:
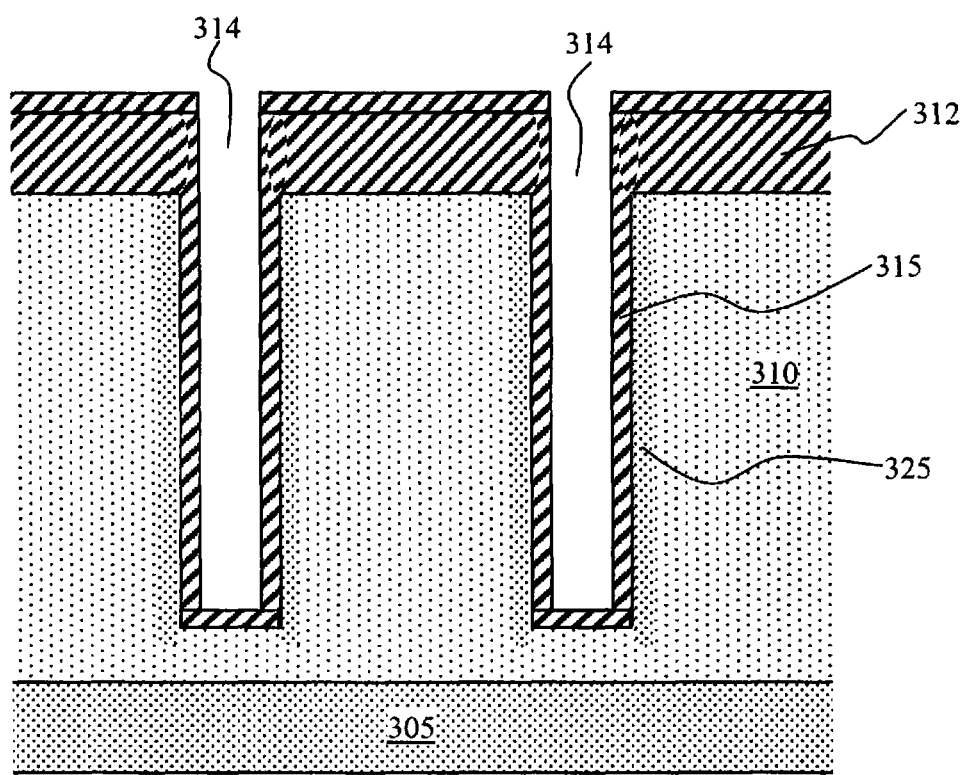
Figure 12E:
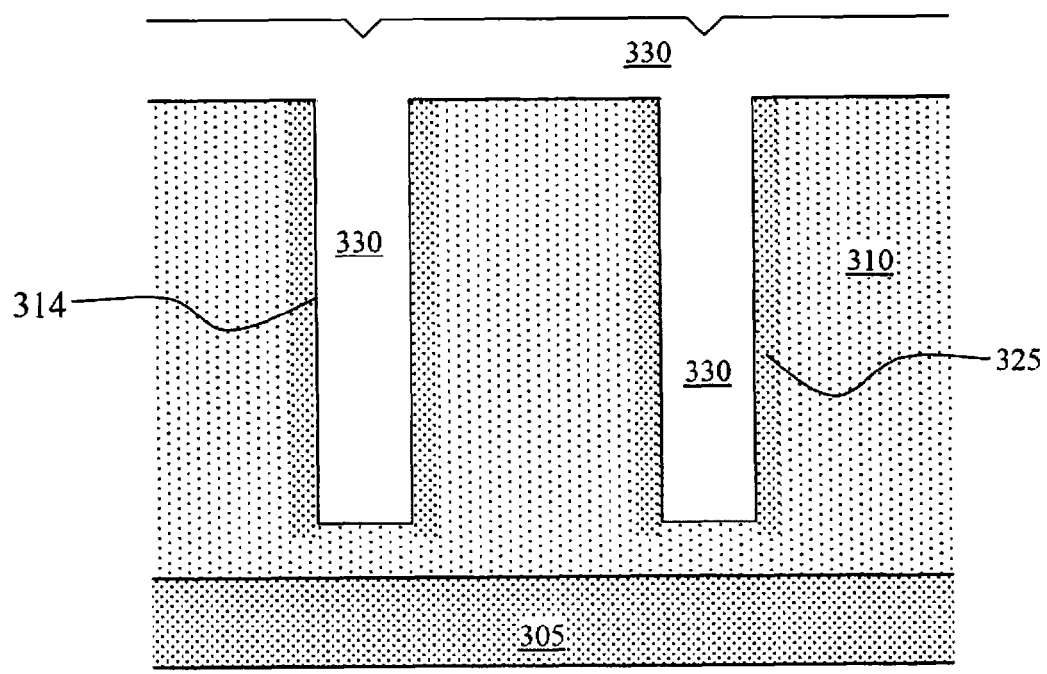
Figure 12F:
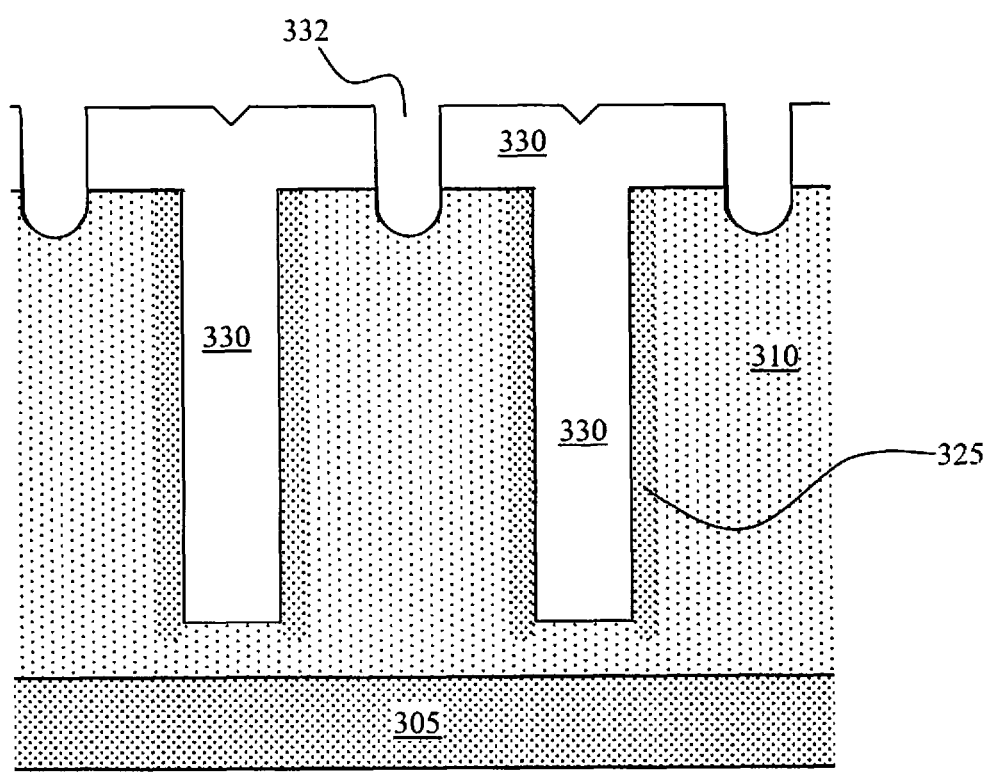

In FIG. 12C, a trench sidewall implant is carried out with N-type ions such as phosphorus ions to adjust the doping concentration in the N top substrate layer 310 An implant with tilted angle and rotated operations are performed with a dosage of 5E11 to 2E13 and a tilt angle of five to fifteen degrees are carried out to form the N-regions 325 in the N top substrate layer 310 between the trenches depending on the trench depth. In FIG. 12D, a high temperature anneal operation at 1050 to 1200 degrees Celsius for 30 to 60 minutes with low oxygen (O2) and/or N2 is applied to laterally diffuse the sidewall implant N-regions 325. Alternatively, the sidewall implants and anneal can be skipped, and the N top substrate layer 310 can be selected ahead of time to have the N-type concentration required for the super-junction effect. In FIG. 12E, the oxide layers 312 and 315 are etched off and a P-epitaxial layer 330 with a P dopant concentration of 1E15 to 1E16 or higher, depending on the required breakdown voltage, is grown. The thickness of the P-epitaxial layer 330 is sufficient to fill the trenches 314. For a trench 314 with a width of about 3 microns, the thickness of the epitaxial layer 330 is approximately 1.5 to 2.0 microns covering the top surface above the trenches 314. In FIG. 12F, an oxide layer is deposited with a thickness of about 0.5 to 1.5 microns as hard-mask layer (not shown) followed by applying a gate trench mask (not shown) to etch the hard-mask oxide layer then removing the photoresist. The width of the gate trench may be of the order of 0.4 to 1.5 microns typically. A silicon etch is carried out to etch the trench gate openings 332 through the P-epitaxial layer 330 with a trench depth of about 1 to 2.5 microns that penetrates through the P-epitaxial layer 330 into the N-dopant regions 325 between the epitaxial columns 330 deposited into the trenches 312. The process is then followed with wafer cleaning and optionally a round hole etching process to smooth the gate trench profile followed by another wafer cleaning process.

Figure 12G:
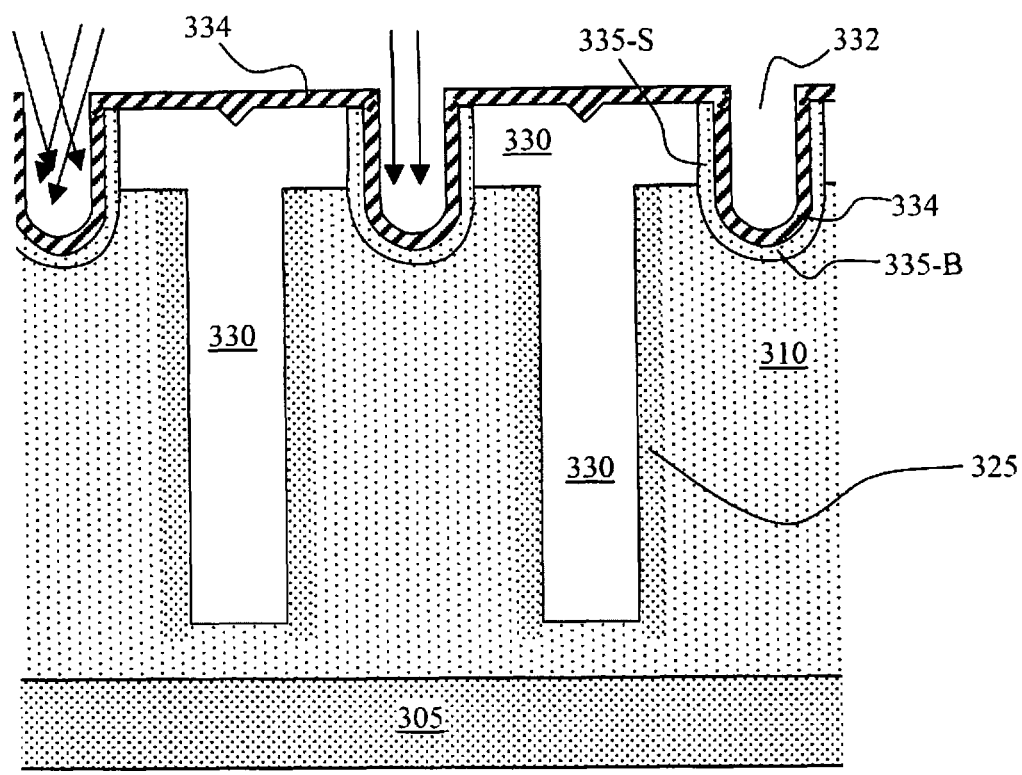
Figure 12H:
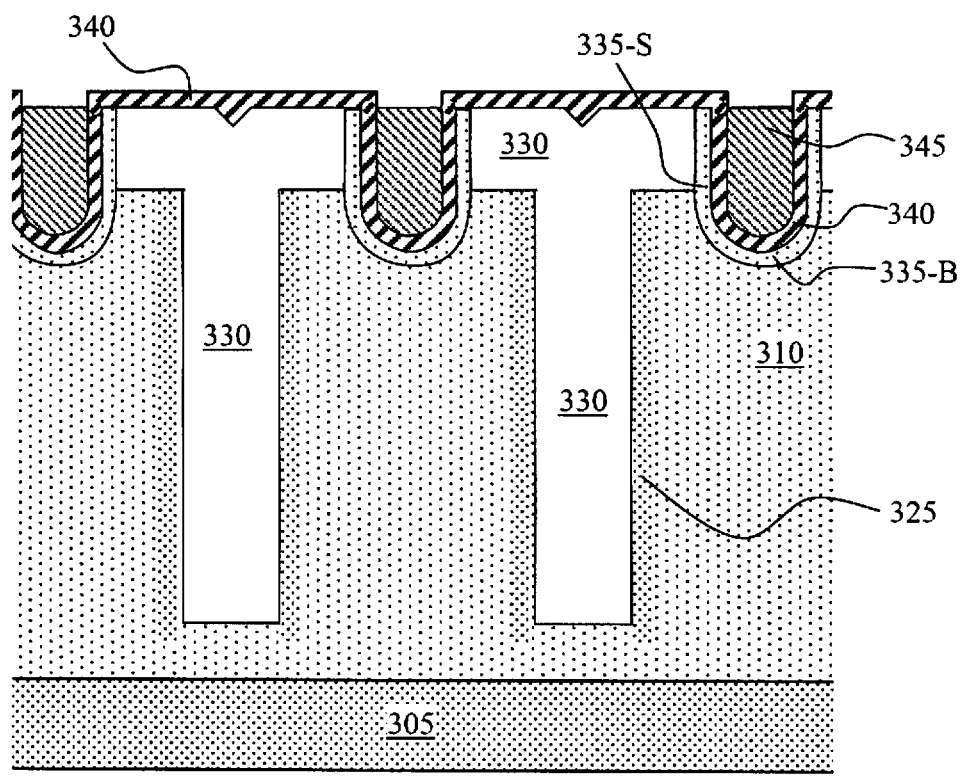

In FIG. 12G, the oxide hard mask is removed followed by depositing a thin screen layer 334 covering the sidewalls and the bottom surface of the gate trenches 332. A trench sidewall-implant with a +/−7 degrees tilt implant angle is carried out optionally to compensate the P-epitaxial layer 330 followed by a trench bottom implant with zero tilt angle to compensate the P-epitaxial layer 330 if the gate trench 332 is too shallow. The implants into the gate trench sidewalls and the bottom surface to form the sidewall and bottom dopant regions 335-S and 335-B respectively is to eliminate the sensitivity of the channel of the MOSFET device relative to the depth of the trench gates and the doping concentration of the P-epitaxial layer 330. In FIG. 12H, the screen oxide layer 334 is removed and a thermal gate oxide layer 340 is grown having a thickness of 0.01 to 0.1 micron: depending on the device voltage rating. A gate polysilicon layer 345 is deposited into the trenches 332. The gate polysilicon layer 345 is preferably performed with in-situ N+ doping and the polysilicon layer 345 is doped by ion implantation or diffusion if the polysilicon layer 345 is not in-situ N+ doped. The gate polysilicon layer 345 is etched back from the top surface surrounding the trenched gates 345.

Figure 12I:
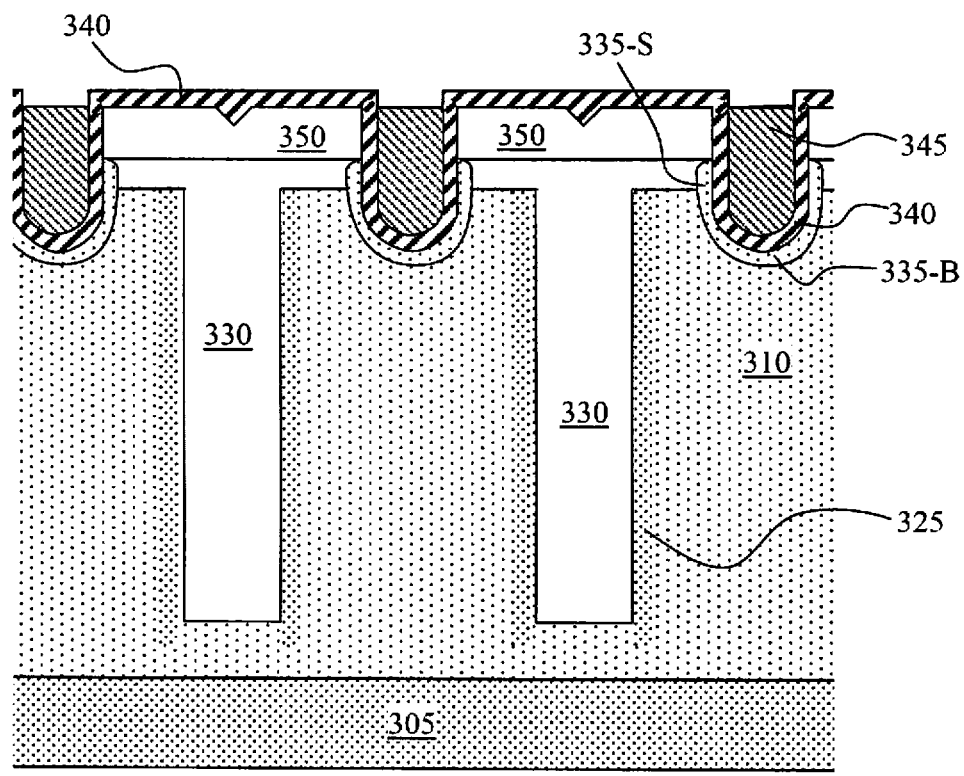
Figure 12J:
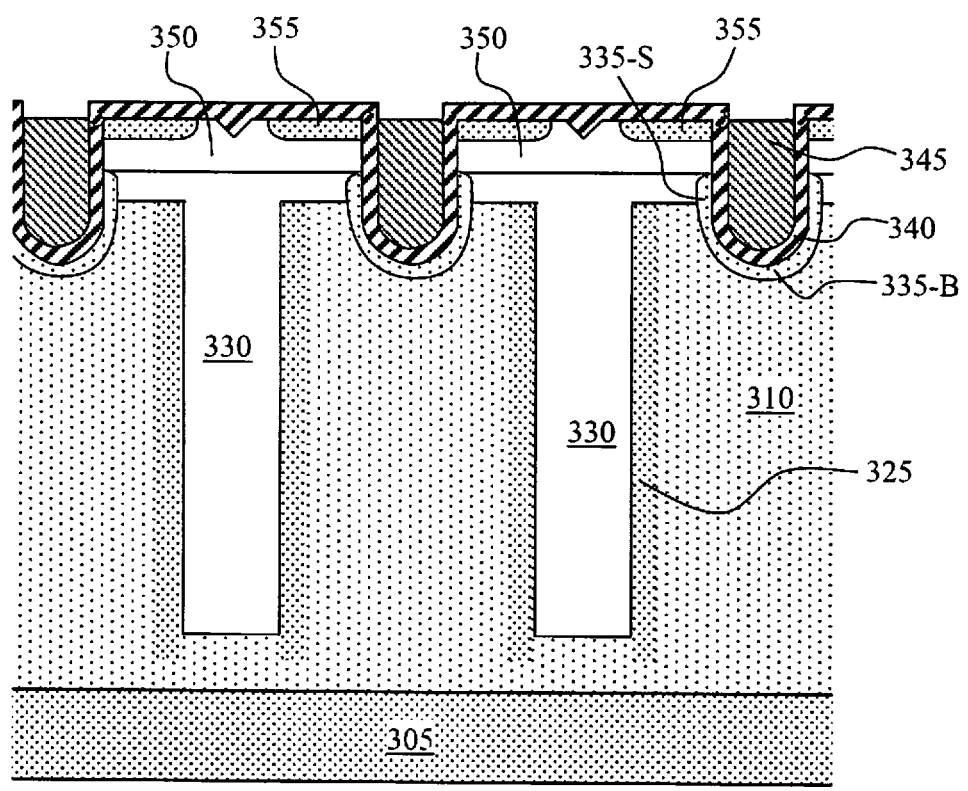
Figure 12K:
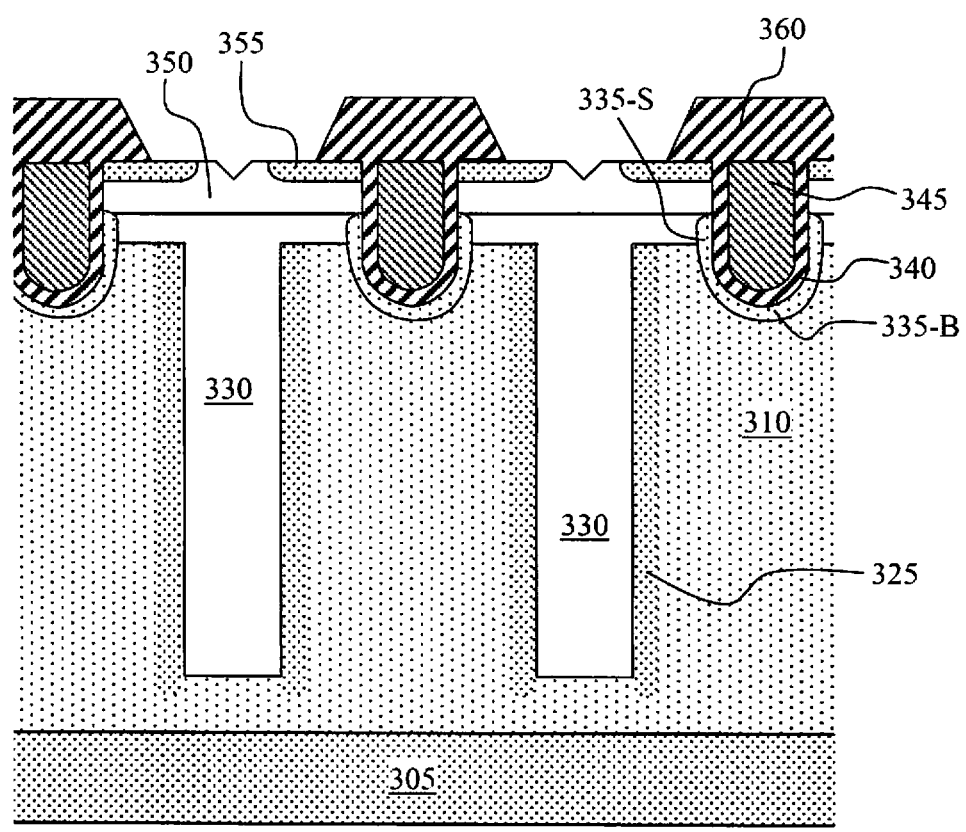
Figure 12L:
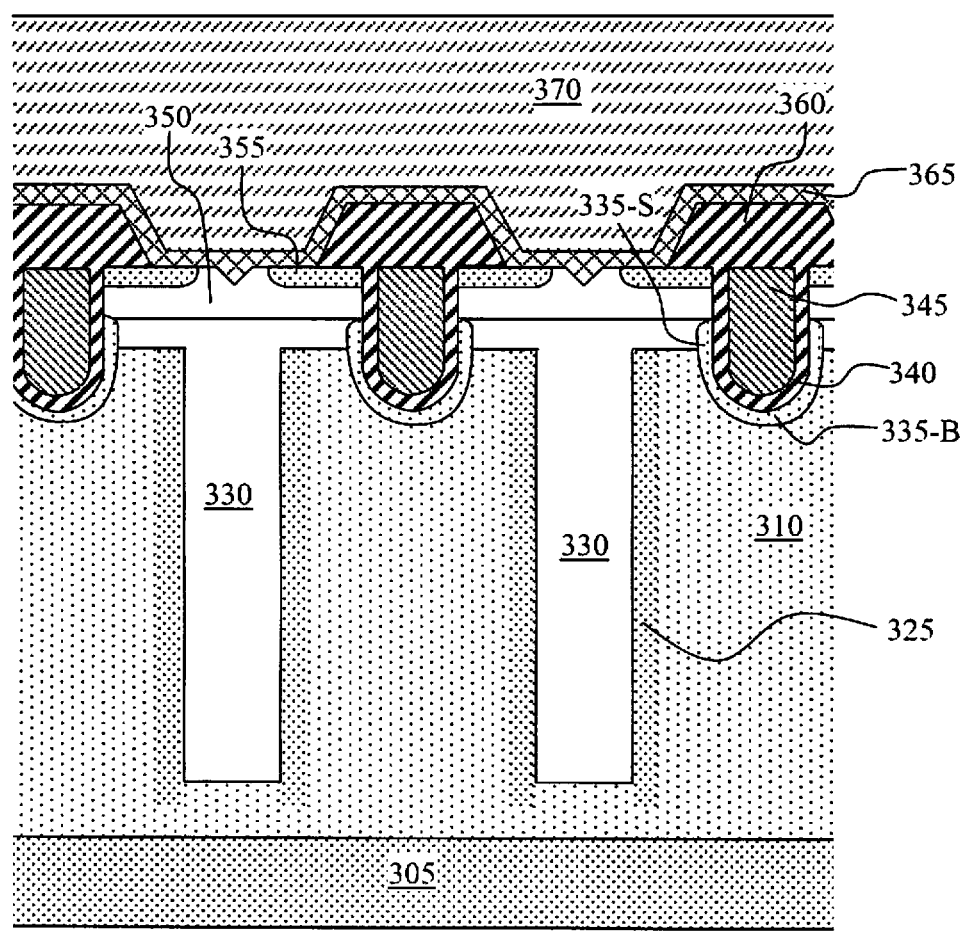
Figure 12M:
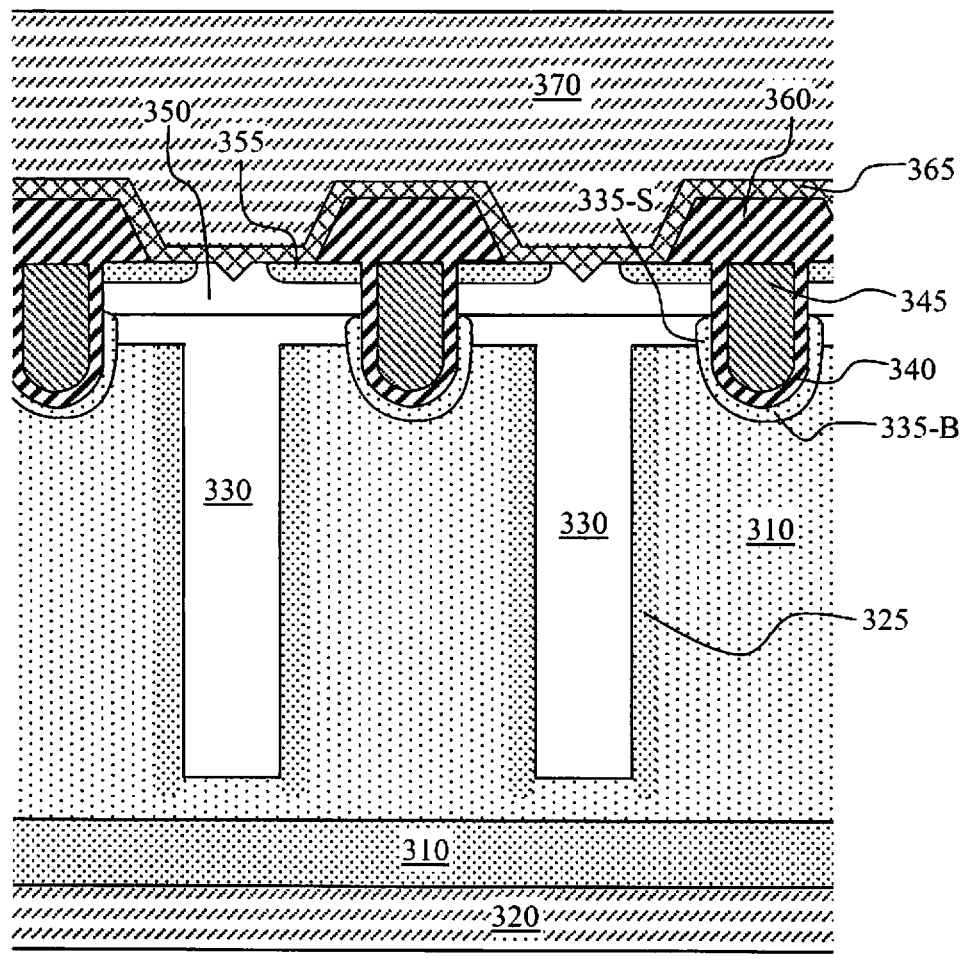

In FIG. 12I, an optionally body mask (not shown) is applied to carry out a body implant with boron for a NMOS device having a dosage ranging from 3E12 to 1E14 followed by a body drive process at a temperature of 1000 to 1150 degree Celsius to form the P-body regions 350 in the epitaxial layer 330 surrounding the trench gates 345. In FIG. 12J, an optional source mask (not shown) is applied to carry out a source dopant implant. The source implant mask is optionally applied to protect the locations to form the P-body contact. The source implant is carried out with source dopant ions such as arsenic ions with a dosage about 4E15 at an energy about 70 KeV at a zero degree tilt followed by a source anneal operation at a temperature of approximately 800 to 950 degrees Celsius to diffuse the source regions 355. In FIG. 12K, a dielectric layer 360 that by a low thermal oxidation (LTO) and BPSG layer is formed to the top surface followed by a BPSG flow process. Then a contact mask (not shown) is applied to carry out an oxide etch to etch the contact openings through the BPSG layer 360. A P+ body contact implant is carried out as an optional step followed by a reflow after the body contact implant. In FIG. 12L, a barrier metal deposition is carried out to cover the top surface with a barrier metal layer 365 followed by a thick metal deposition to form the source metal layer 370. A metal mask (not shown) is applied to etch and pattern the source metal and gate metalization. The processes are completed with the deposition of dielectric layers to passivate the device surface and the patterning of the passivation layer to form the bond pad openings (not shown). A final alloy process can then be performed. For the sake of brevity, these standard manufacturing processes are not specifically described here. In FIG. 12M, an optional backside grinding operation is carried out to remove the a portion of the bottom of the N+ bottom substrate 305 then a back metal layer 320 is formed to contact the N+ bottom substrate 305 as the drain electrode. The back metal layer 320 may be formed by a deposition of TiNiAg layer directly below the N+ bottom substrate 305. The back grinding operation has a thickness control with a few microns, and even down to one micron thus enables a reliable backside contact to form the drain electrode layer 320 to contact the N+ bottom substrate 305.

Figure 13A:
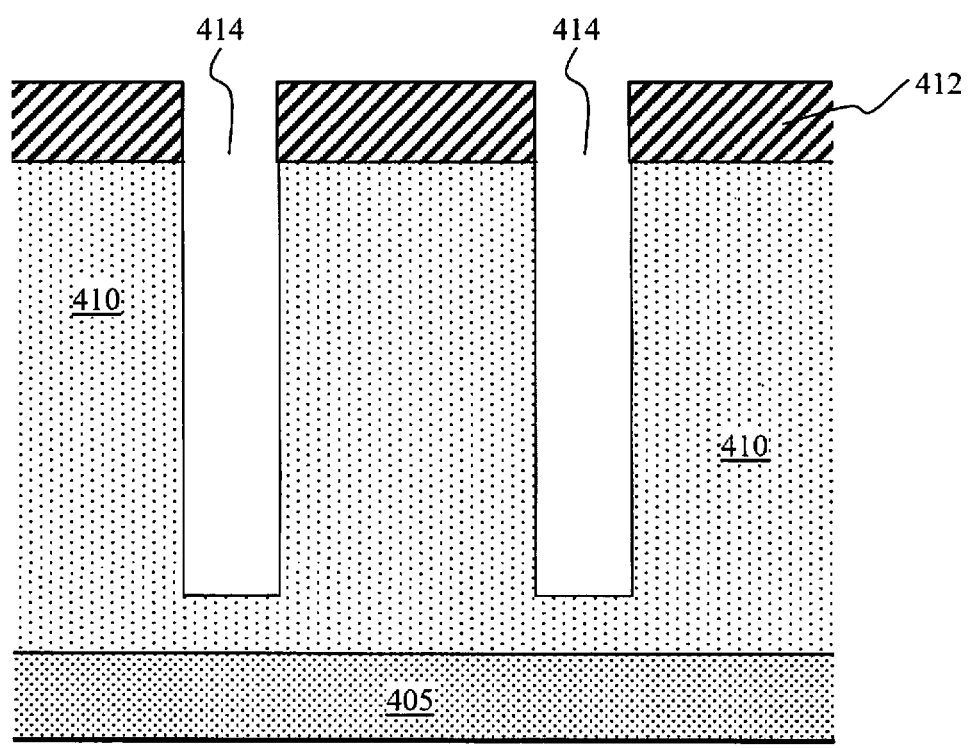
FIGS. 13A to 13M are a series of cross sectional views to illustrate processing steps of this invention to manufacture another exemplary embodiment of a charge-balanced power device with super junction structure of this invention.
Figure 13B:
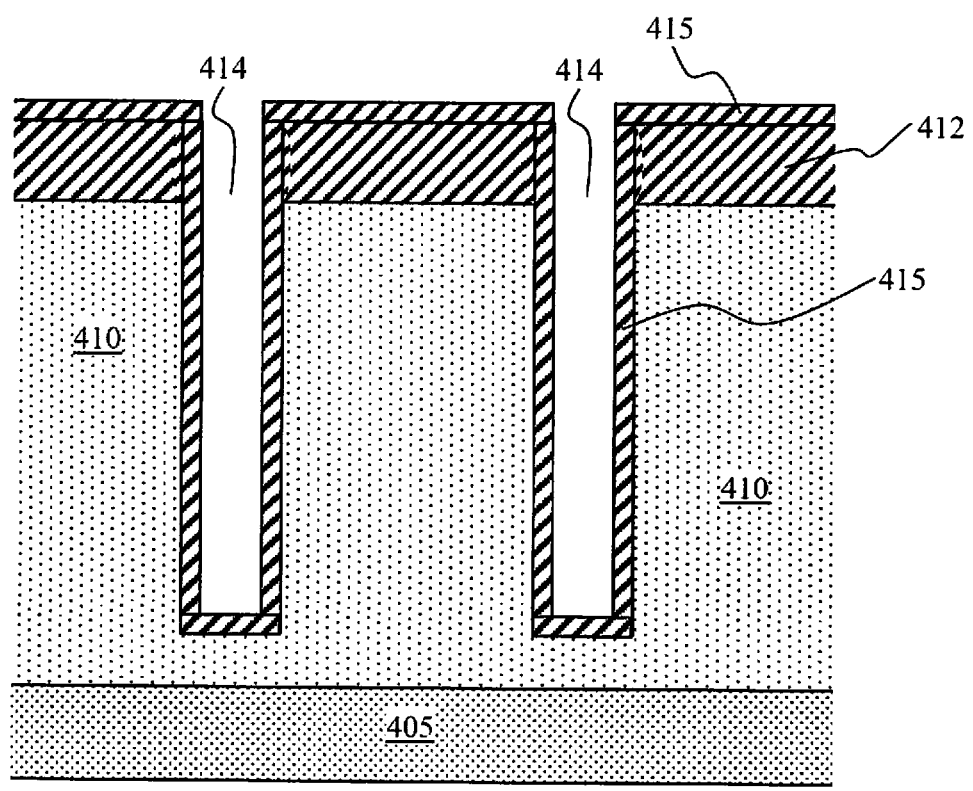

Referring to FIGS. 13A to 13M for a serial of side cross sectional views to illustrate the processing steps for manufacturing a charge balanced semiconductor power device as another exemplary embodiment of this invention. FIG. 13A shows a starting silicon substrate comprises an N+ CZ bottom substrate 405 supports an N top substrate layer 410 grown on top of it. The N+ bottom substrate 405 is preferably a substrate with a resistivity in a range between 0.003 to 0.005 ohm/cm and the N top substrate layer 410 for NMOS has a thickness that is dependent on the breakdown voltage. For a device having a breakdown voltage approximately 600 volts or higher, a top substrate layer 410 has a thickness of 45 to 55 microns is used. A hard mask oxide layer 412 is deposited or thermally grown with a thickness of 0.1 to 1.5 micrometer. Then a trench mask (not shown), with a critical dimension (CD) in a 1 to 5 microns range (preferable 3.0 microns), is applied to carry out an oxide etch to open a plurality of trench etching windows followed by removal of the photoresist. A silicon etch is carried out to open deep trenches 414 in the top substrate layer 410 with a depth of 40 to 50 microns for devices operated at a voltage of about 650 volts. Depending on the type etcher and etch chemistries, photoresist only mask may also be used to pattern and open the trench as well instead of using the hard mask oxide layer 412 as shown. The trench opening may be in the 1 micron to 5 microns range preferably 3 microns for most applications. Then a wafer cleanup process is performed. In FIG. 13B, a conformal oxide layer 415 is formed by either an oxide deposition or thermal growth process. Then an optional RIE anisotropic etch is carried out to clear the oxide from the bottom of the trench bottom surface if the oxide layer is thicker on the bottom surface. The thickness of the oxide layer 415 is between 0.015 to 0.1 mm when the process does not include the optional RIE step and the layer thickness of the oxide layer 415 is between 0.1 to 0.4 micrometers when the processes include the optional RIE step.

Figure 13C:
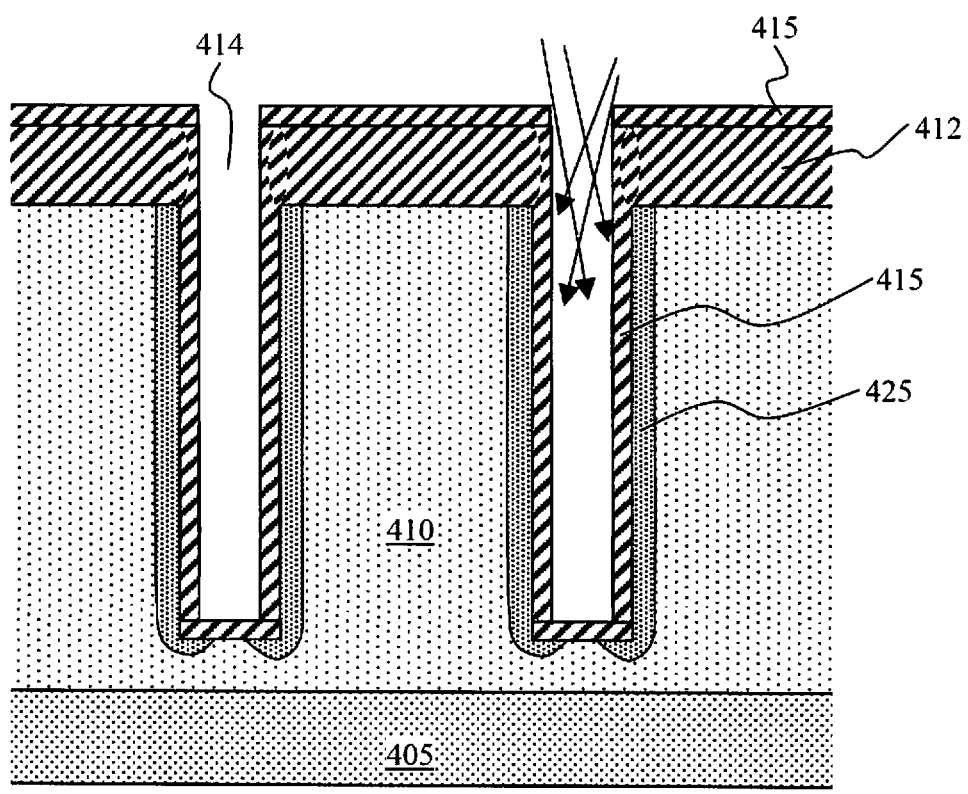
Figure 13D:
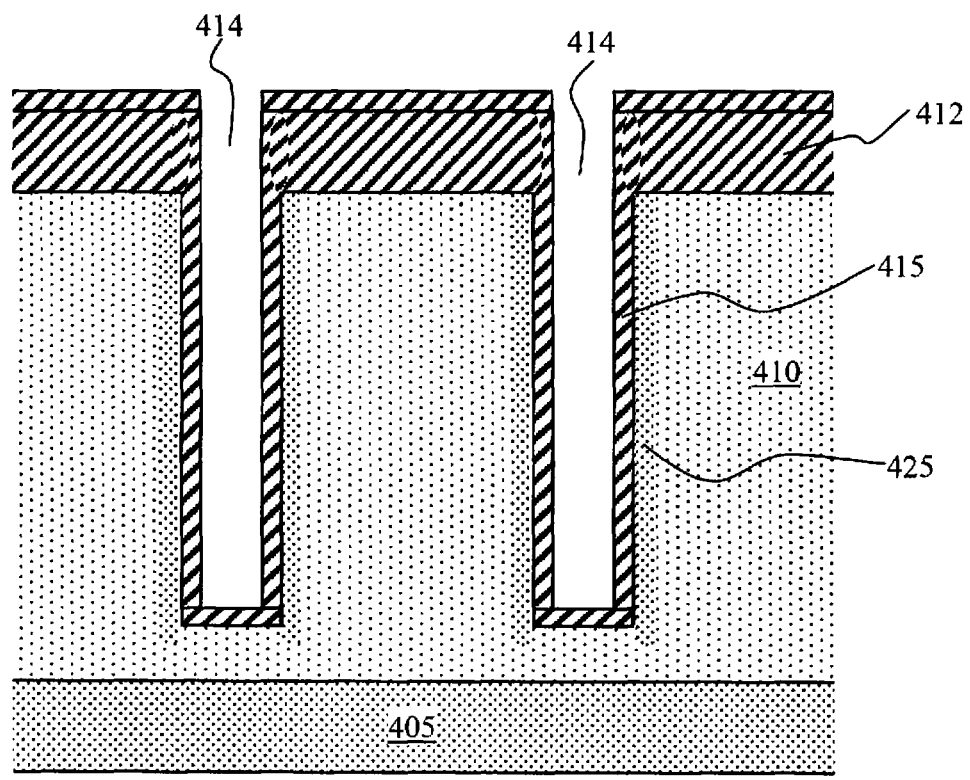
Figure 13E:
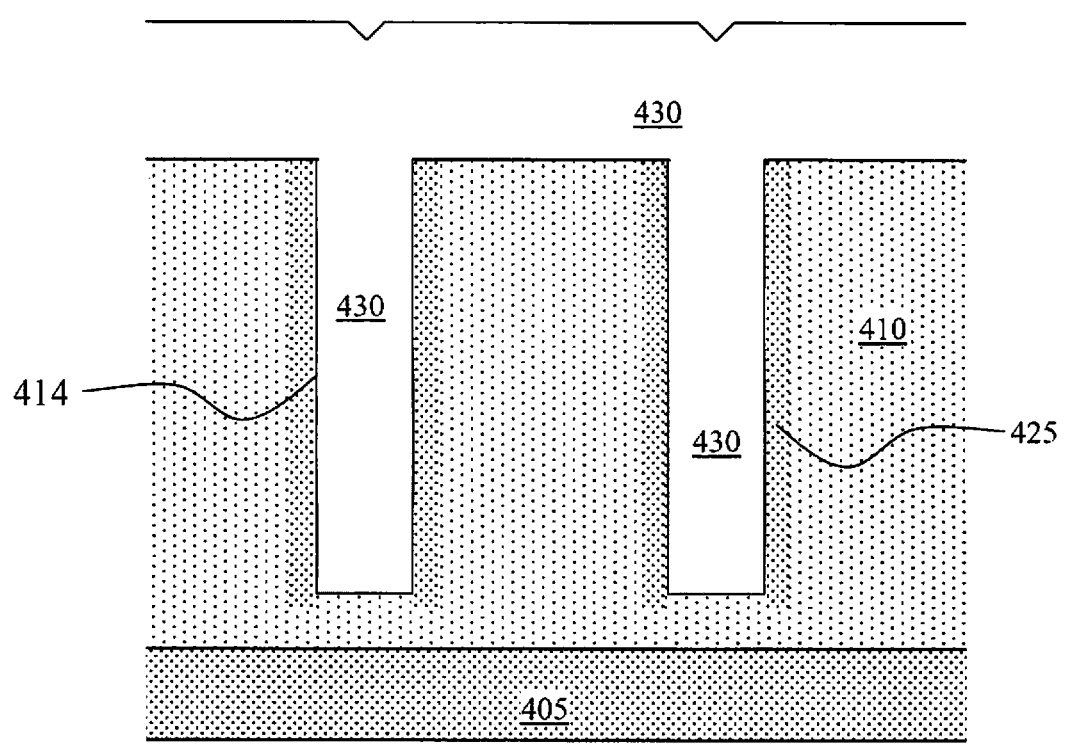
Figure 13F:
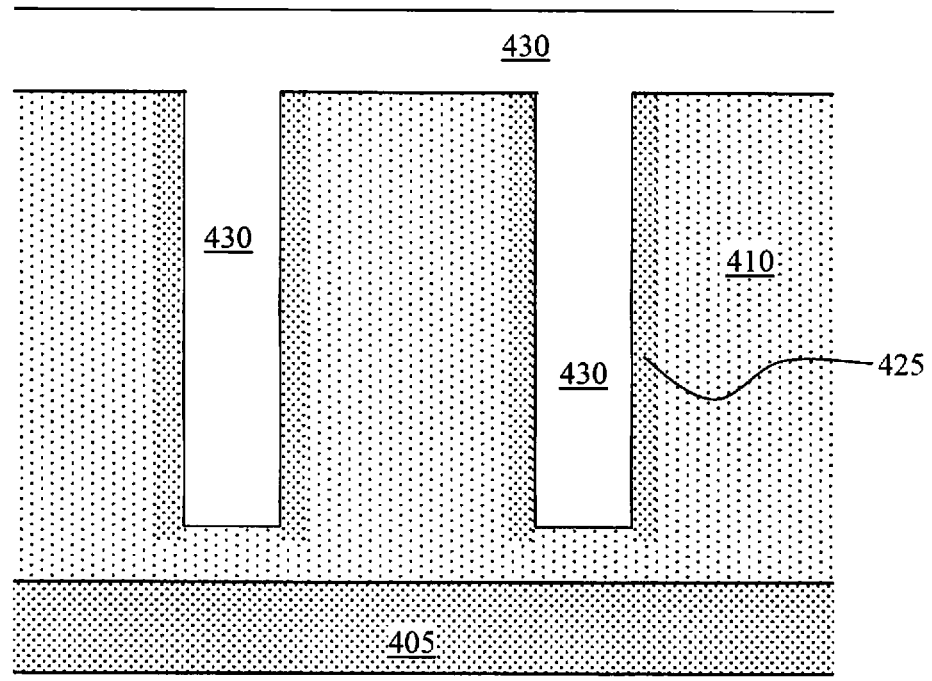
Figure 13G:
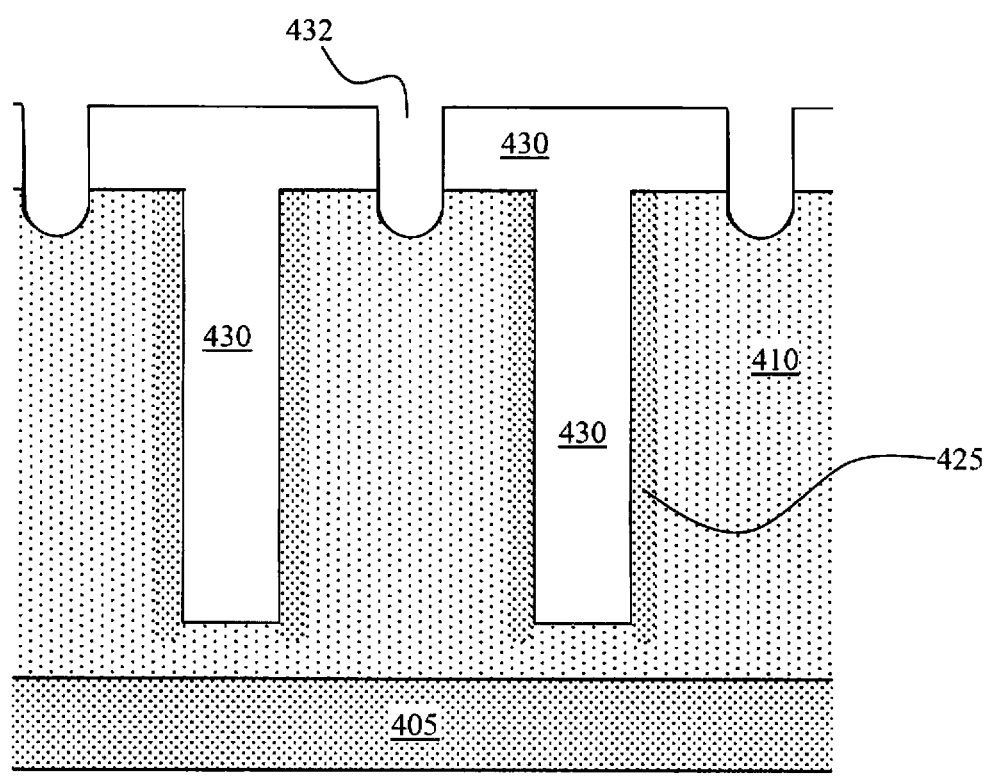

In FIG. 13C, a trench sidewall implant is carried out with N-type ions such as phosphorous ions to set the doping concentration in the N regions. An implant with tilted angle and rotated operations are performed with a dosage of 5E11 to 2E13 and a tilt angle of five to fifteen degrees and rotational implants are carried out to form the N-regions 425 between the trenches depending on: the trench depth. In FIG. 13D, a high temperature anneal operation at 1050 to 1200 degrees Celsius for 30 to 60 minutes with low oxygen (O2) and/or N2 is applied to laterally diffuse the sidewall implant N-regions 425 through the top substrate layer 410. In FIG. 13E, the oxide layers 412 and 415 are etched off and a P-epitaxial layer 430 with a P dopant concentration on 1E15 to 1E16 is grown. The thickness of the P-epitaxial layer 430 is sufficient to fill the trenches 414. For a trench opening 414 with a depth of about 3 microns, the thickness of the epitaxial layer 430 is approximately 1.5 to 2.0 microns having a thickness higher than half of the trench critical dimension (CD) covering the top surface above the trenches 414. In FIG. 13F, a partial etch back of the P-epitaxial layer 430 is carried out by applying a chemical mechanical planarization (CMP) or a RIE process leaving a planar layer of the P-epitaxial layer 430 on the top surface. In FIG. 13G, an oxide layer is deposited with a thickness of about 0.5 to 1.5 microns as hard-mask layer (not shown) followed by applying a gate trench mask (not shown) to etch the hard-mask oxide layer then removing the photoresist. A silicon etch is carried out to etch the trench gate openings 432 through the P-epitaxial layer 430 with a trench depth of about 1 to 2.5 microns that penetrates through the P-epitaxial layer 430 into the N-dopant regions 425 between the epitaxial columns 430 deposited into the trenches 412. The processes then followed with wafer cleaning and optionally a round hole etch to smooth the gate trench profile followed by another wafer cleaning process.

Figure 13H:
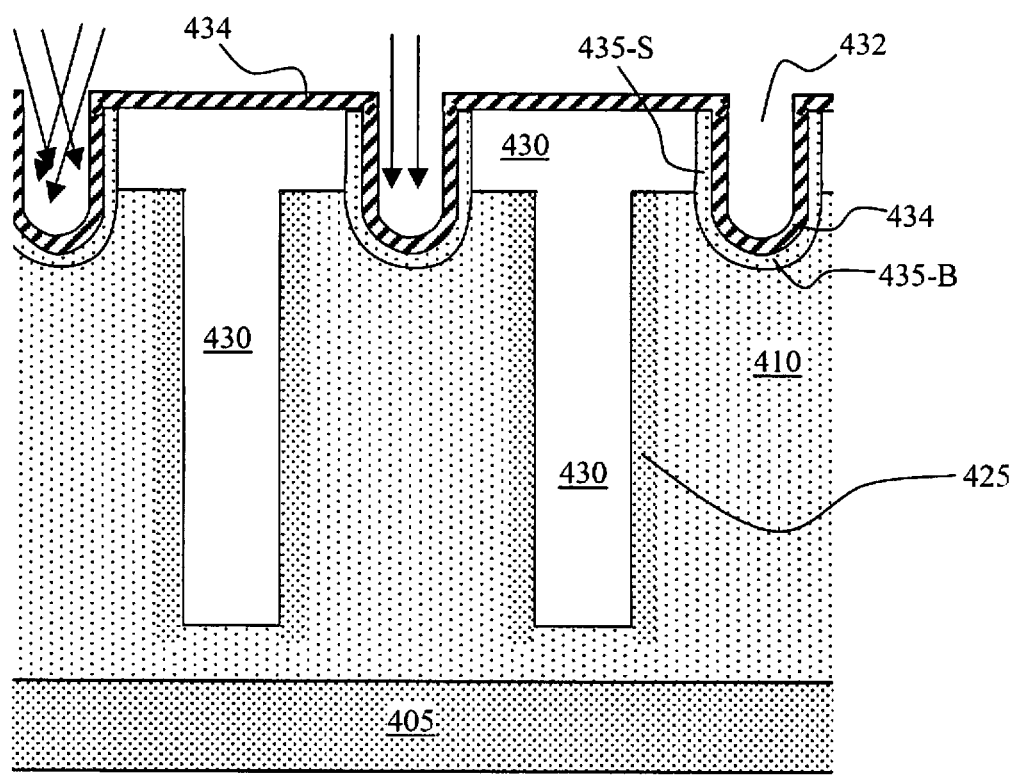
Figure 13I:
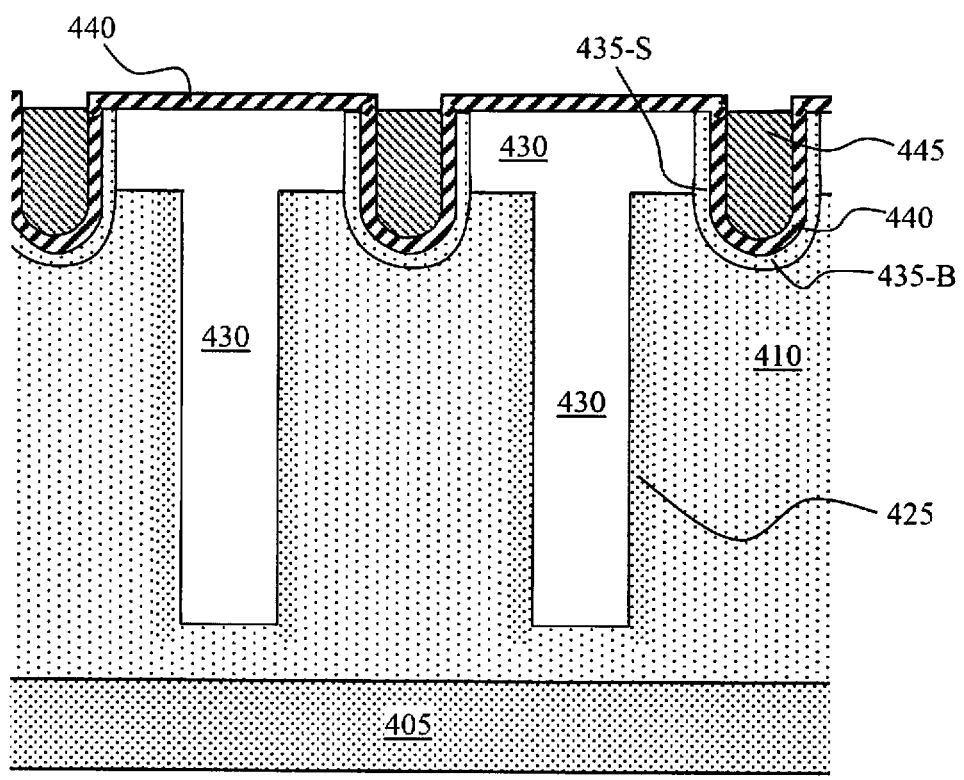

In FIG. 13H, the oxide hard mask is removed followed by depositing a thin screen layer 434 covering the sidewalls and the bottom surface of the gate trenches 432. A trench sidewall-implant with a +/−7 degrees tilt implant angle is carried out optionally to compensate the P-epitaxial layer 430 followed by a trench bottom implant with zero tilt angle to compensate the P-epitaxial layer 430 if the gate trench 432 is too shallow. The implants into the gate trench sidewalls and the bottom surface to form the sidewall and bottom dopant regions 435-S and 435-B respectively is to eliminate the sensitivity of the channel of the MOSFET device relative to the depth of the trench gates and the doping concentration of the P-epitaxial layer 430. In FIG. 13I, the screen oxide layer 434 is removed and a thermal gate oxide layer 440 is grown having a thickness of 0.01 to 0.1 micron depending on the device rating. A gate polysilicon layer 445 is deposited into the trenches 432. The gate polysilicon layer 445 is preferably performed with in-situ N+ polysilicon and the polysilicon layer 445 is doped if the polysilicon layer 445 is not in-situ N+ polysilicon. The gate polysilicon layer 445 is etched back from the top surface surrounding the trenched gates 445.

Figure 13J:
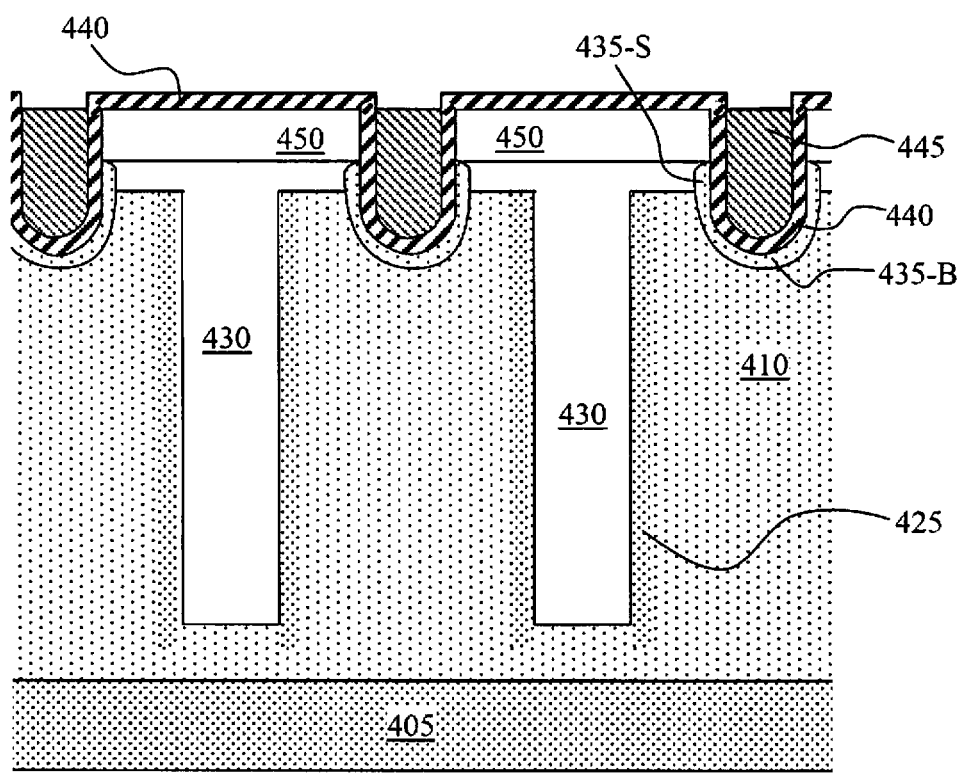
Figure 13K:
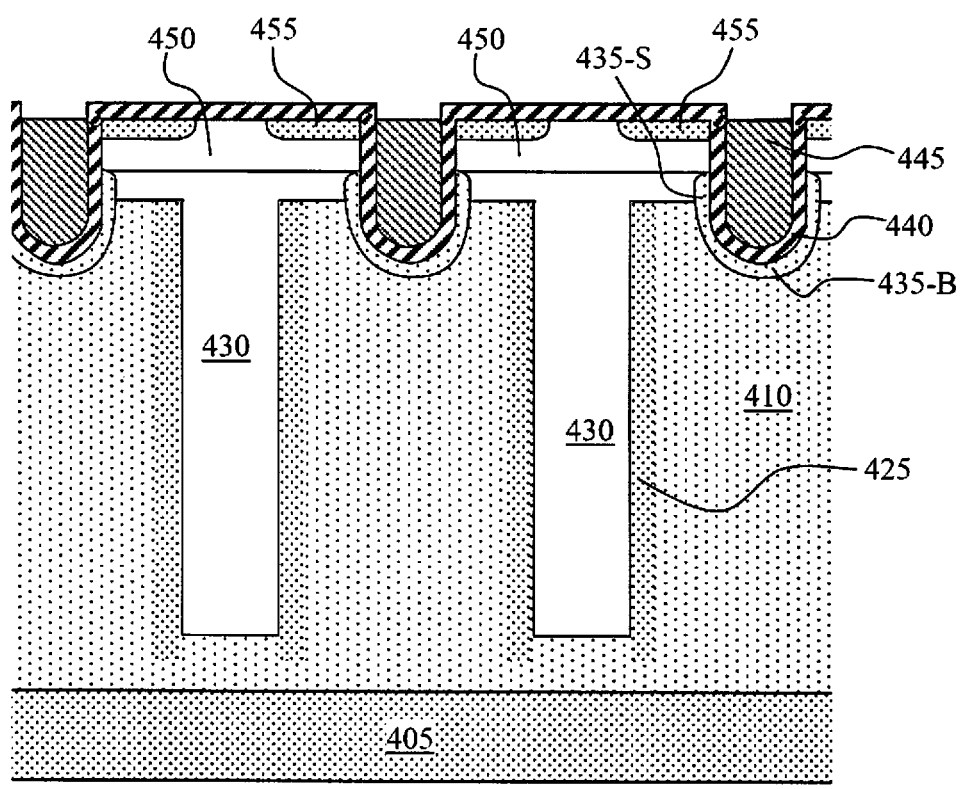
Figure 13L:
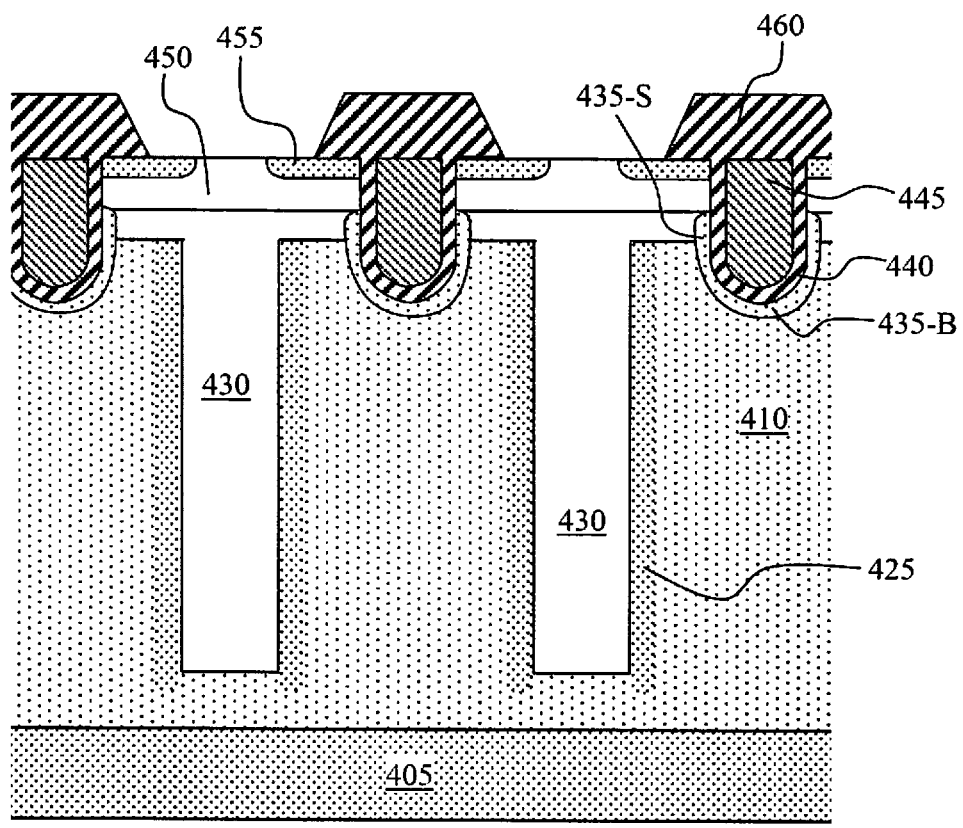
Figure 13M:
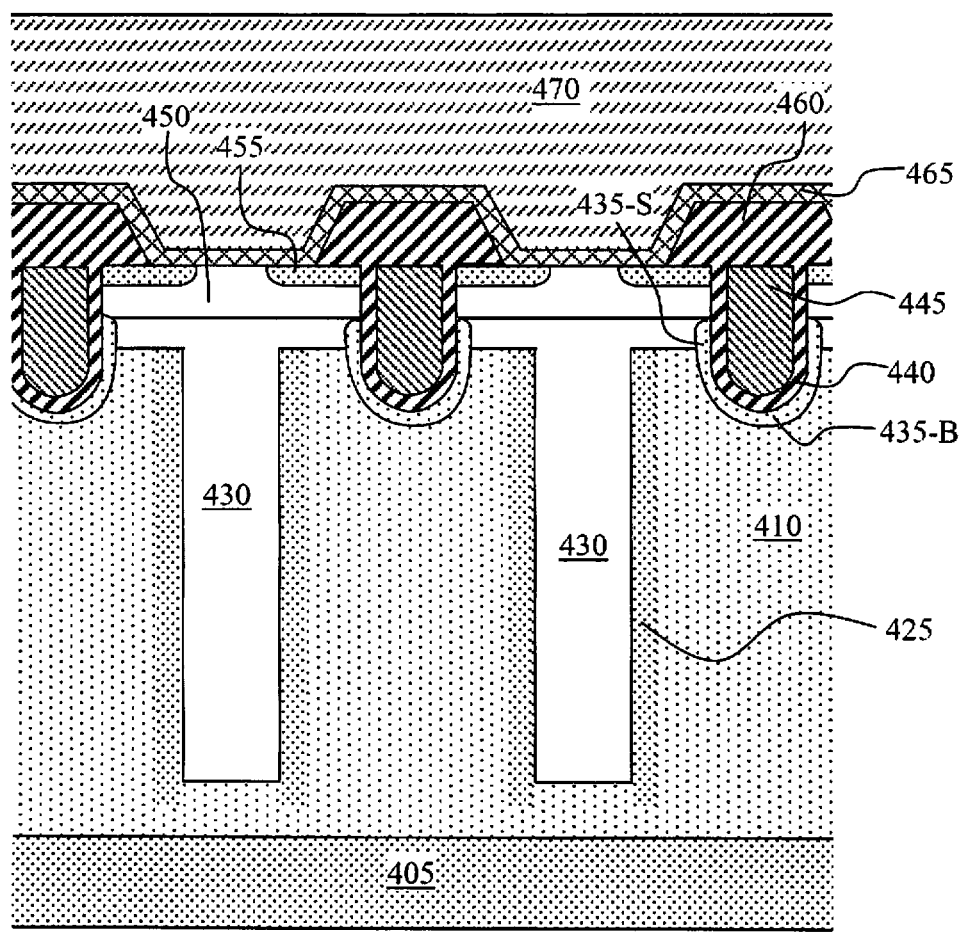

In FIG. 13J, an optional body mask (not shown) is applied to carry out a body implant with boron for a NMOS device having a dosage ranging from 3E12 to 1E14 followed by a body drive process at a temperature of 1000 to 1150 degree Celsius to form the P-body regions 450 in the epitaxial layer 430 surrounding the trench gates 445. In FIG. 13K, an optional source mask (not shown) is applied to carry out a source dopant implant. The source implant mask is optionally applied to protect the locations to form the P-body contact. The source implant is carried out with source dopant ions such as arsenic ions with a dosage about 4E15 at an energy about 70 Kev at a zero tilt degree followed by a source anneal operation at a temperature of approximately 800 to 950 degrees Celsius to diffuse the source regions 455. In FIG. 13L, a dielectric layer 460 that by a local thermal oxidation (LTO) and BPSG layer is formed to the top surface followed by a BPSG flow process. Then a contact mask (not shown) is applied to carry out an oxide etch to etch the contact openings through the BPSG layer 460. A P+ body contact implant is carried out as an optional step followed by a reflow after the body contact implant. In FIG. 13M, a barrier metal deposition is carried out to covering the top surface with a barrier metal layer 465 followed by a thick metal deposition to form the source metal layer 470. A source metal mask (not shown) is applied to etch and pattern the source metal contact layer to contact the source/body regions. The processes are completed with the formation and the patterning of the passivation layer and the formation and the patterning of the contact pads with a final alloy process. Furthermore, a backside grinding operation is carried out to remove the bottom portion of the N+ bottom substrate 405 from the bottom surface of the substrate then a back metal layer (not specifically shown) is formed to contact the bottom substrate 405 as the drain electrode. The back metal layer may be formed by a deposition of TiNiAg layer directly below the bottom substrate 405. The back grinding operation has a thickness control with a few microns and even down to one micron thus enables a reliable backside contact to form the drain electrode layer to contact the N+ bottom substrate 405 near the bottom of the substrate. For the sake of brevity, these standard manufacturing processes are not specifically described here or shown in the figures. The processing steps are similar to that shown in FIGS. 9A to 9L but with a partial CMP of the P-epitaxial layer to smooth out the P-epitaxial layer 430. This alternate embodiment has the advantage of having a smooth out P-epi surface. It also enables the use of shallower gate trench. The partial CMP of the P-epitaxial layer may also be applied to other embodiments of the invention.

Although the present invention has been described in terms of the presently preferred embodiment, it is to be understood that such disclosure is not to be interpreted as limiting. For example, though the above describes an n-channel device, this invention can be applied to p-channel devices as well simply by reversing the conductivity types of the doped regions. Various alterations and modifications will no doubt become apparent to those skilled in the art after reading the above disclosure. Accordingly, it is intended that the appended claims be interpreted as covering all alterations and modifications as fall within the true spirit and scope of the invention.

I claim:

1. A semiconductor power device comprising:
a semiconductor substrate comprising a bottom substrate and a top substrate layer grown over the bottom substrate, wherein the top substrate layer and the bottom substrate are of a same conductivity type, wherein the semiconductor substrate further includes it plurality of deep trenches;
an epitaxial layer filling said deep trenches, the epitaxial layer further including a simultaneously grown top epitaxial layer covering areas above a top surface of said deep trenches and over said semiconductor substrate, wherein the epitaxial layer is of an opposite conductivity type as the semiconductor substrate;
a plurality of trench MOSFET cells disposed in said to epitaxial layer with the top epitaxial layer acting as the boil region and the semiconductor substrate acting as the drain region whereby a super-junction effect is achieved through charge balance between the portions of the epitaxial layer in the deep trenches and the portions of the top substrate layer lateral to the deep trenches; and
each of said plurality of trench MOSFET cells includes a trench. DMOS transistor cell having a trench gate opened through said top epitaxial layer having a gate trench depth less than or equal to a thickness of said top epitaxial layer and said trench gate is filled with it gate dielectric material and a gate conductor material, the gate trench further comprising gate sidewall dopant regions surrounding sidewalk of said trench gate and a gate-bottom dopant region below said trench gate, wherein the gate sidewall dopant regions and gate-bottom dopant regions are of a same conductivity type as the semiconductor substrate.

2. A semiconductor power device comprising:
a semiconductor substrate comprising a bottom substrate and a top substrate layer grown over the bottom substrate, wherein the top substrate layer and the bottom substrate are of a same conductivity type, wherein the semiconductor substrate further includes a plurality of deep trenches;
epitaxial layer filling said deep trenches, the epitaxial layer further including a simultaneously grown top epitaxial layer covering areas above, a top surface of said deep trenches and over said semiconductor substrate, wherein the epitaxial layer is of an opposite conductivity type as the semiconductor substrate;
a plurality of trench MOSFET cells disposed in said top epitaxial layer with the top epitaxial layer acting as the body region and the semiconductor substrate acting as the drain region whereby a super-junction effect is achieved through charge balance between the portions of the epitaxial layer in the deep trenches and the portions of the top substrate layer lateral to the deep trenches; and
said semiconductor substrate further includes a lateral doping concentration gradient with the concentration being the highest next to the deep trench sidewalls.

3. The semiconductor power device of claim 2 wherein:
each of said plurality of trench MOSFET cells includes a trench DMOS transistor cell having a trench gate opened through said top epitaxial layer and penetrating into a top portion of said semiconductor substrate and said trench gate is filled with a gate dielectric material.

4. The semiconductor power device of claim 2 wherein:
the bottom of the deep trenches reaches the bottom substrate.

5. The semiconductor power device of claim 2 wherein:
the bottom of the deep trenches does not reach the bottom substrate.

6. A semiconductor power device comprising:
a semiconductor substrate comprising a bottom substrate and a top substrate layer grown, over the bottom substrate, wherein the top substrate layer and the bottom substrate are of a same conductivity type, wherein the semiconductor substrate further includes a plurality of deep trenches;

an epitaxial layer filling said deep trenches, the epitaxial layer further including a simultaneously grown top epitaxial layer covering areas above a top surface of said deep trenches and over said semiconductor substrate, wherein the epitaxial layer is of an opposite conductivity type as the semiconductor substrate;

a plurality of trench MOSFET cells disposed in said top epitaxial layer with the top epitaxial layer acting as the body region and the semiconductor substrate acting as the drain region whereby a super-junction effect is achieved through charge balance between the portions of the epitaxial layer in the deep trenches and the portions of the top substrate layer lateral to the deep trenches;

each of said DMOS transistor cells further having gate sidewall do ant regions surrounding sidewalk of said trench gate and a gate-bottom dopant region below said trench gate, wherein the gate sidewall dopant regions and gate-bottom dopant regions are of a same conductivity type as the semiconductor substrate.

7. The semiconductor power &vice of claim 6 wherein:
each of plurality of trench MOSFET cells includes a trench DMOS transistor cell having a trench gate opened through said top epitaxial layer and penetrating into a top portion of said semiconductor substrate and said trench gate is filled with a gate dielectric material.

8. The semiconductor power device of claim 6 wherein the bottom of the deep trenches reaches the bottom substrate.

9. The semiconductor power device of claim 6 wherein:
the bottom of the deep trenches does no roach the bottom substrate.

* * * * *